United States Patent
Ma

(10) Patent No.: US 11,195,949 B2
(45) Date of Patent: Dec. 7, 2021

(54) LATERALLY DIFFUSED METAL-OXIDE-SEMICONDUCTOR (LDMOS) TRANSISTORS

(71) Applicant: SEMICONDUCTOR COMPONENTS INDUSTRIES, LLC, Phoenix, AZ (US)

(72) Inventor: Cho Chiu Ma, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/948,215

(22) Filed: Sep. 9, 2020

(65) Prior Publication Data

US 2021/0119041 A1 Apr. 22, 2021

Related U.S. Application Data

(60) Provisional application No. 62/923,854, filed on Oct. 21, 2019.

(51) Int. Cl.
*H01L 29/78* (2006.01)
*H01L 29/06* (2006.01)
(Continued)

(52) U.S. Cl.
CPC ........ *H01L 29/7816* (2013.01); *H01L 29/063* (2013.01); *H01L 29/0649* (2013.01);
(Continued)

(58) Field of Classification Search
CPC .......... H01L 29/7816; H01L 29/66681; H01L 29/42368; H01L 29/513; H01L 29/0882;
(Continued)

(56) References Cited

U.S. PATENT DOCUMENTS 6,118,152 A * 9/2000 Yamaguchi ....... H01L 21/76264
257/347
7,875,517 B2 1/2011 Cai
(Continued)

FOREIGN PATENT DOCUMENTS

CN 104112775 A * 10/2014 ......... H01L 29/7816

*Primary Examiner* — Joseph C. Nicely
(74) *Attorney, Agent, or Firm* — Brake Hughes Bellermann LLP

(57) ABSTRACT

In a general aspect, a laterally diffused metal-oxide-semiconductor (LDMOS) transistor can include: a substrate of a first conductivity type; a buried well region of a second conductivity type disposed in the substrate; a body region of the first conductivity type disposed on the buried well region, a drift region of the second conductivity type disposed in the body region, a drain implant of the second conductivity type disposed in the drift region; a source implant of the second conductivity type disposed in the body region; and a gate structure disposed on the drift region. The gate structure can include: a field plate including a RESURF dielectric layer; a gate dielectric layer; and a gate electrode disposed on the field plate and the gate dielectric layer. The LDMOS transistor can also include a drain contact extending through the field plate and defining an Ohmic contact with the drain implant.

20 Claims, 15 Drawing Sheets

(51) Int. Cl.
*H01L 29/40* (2006.01)
*H01L 29/417* (2006.01)
*H01L 29/66* (2006.01)
*H01L 29/423* (2006.01)

(52) U.S. Cl.
CPC .......... *H01L 29/401* (2013.01); *H01L 29/402* (2013.01); *H01L 29/41758* (2013.01); *H01L 29/42368* (2013.01); *H01L 29/66681* (2013.01)

(58) Field of Classification Search
CPC ........... H01L 29/66674; H01L 29/7801; H01L 29/401; H01L 21/022
See application file for complete search history.

(56) References Cited

U.S. PATENT DOCUMENTS

| | | | |
|---|---|---|---|
| 8,119,507 B2 | 2/2012 | You | |
| 11,088,277 B2* | 8/2021 | Yadav | H01L 29/402 |
| 2003/0141559 A1* | 7/2003 | Moscatelli | H01L 29/66659 |
| | | | 257/406 |
| 2013/0140632 A1* | 6/2013 | Landgraf | H01L 29/401 |
| | | | 257/335 |
| 2020/0013890 A1* | 1/2020 | Edwards | H01L 29/66681 |
| 2021/0184005 A1* | 6/2021 | Liu | H01L 29/66681 |

* cited by examiner

LATERALLY DIFFUSED METAL-OXIDE-SEMICONDUCTOR (LDMOS) TRANSISTORS

CROSS REFERENCE TO RELATED APPLICATION

This application claims the benefit of and priority to U.S. Provisional Application No. 62/923,854, filed Oct. 21, 2019, which is incorporated by reference herein in its entirety.

TECHNICAL FIELD

This description relates to laterally diffused metal-oxide semiconductor (LDMOS) transistor devices and associated methods of manufacture.

BACKGROUND

Producing laterally diffused metal-oxide semiconductor (LDMOS), such as low voltage LDMOS transistors, can present a number of challenges. For instance, reducing cell pitch of an LDMOS is desirable for cost and performance considerations. However, producing LDMOS transistors that have small cell pitch can, as the cell pitch decreases, result in an increase in gate charge (Qg) and an associated Figure of Merit (FoM) (e.g., drain to source on resistance multiplied by Qg) of the transistor. Such increases in Qg and FoM are undesirable, and can make such devices unsuitable for certain applications, such as power converter applications. Further, current approaches for reducing Qd can also have drawbacks, such as performing etch operations that can result in a reduction of shallow trench isolation (STI) regions in other device type areas. For instance, such a loss of STI can result in increased leakage, such as in CMOS devices that are produced with LDMOS devices (transistors) in hybrid semiconductor manufacturing processes, e.g., bipolar, complementary MOS (CMOS) and DMOS (BCD) semiconductor process platforms.

SUMMARY

In a general aspect, a laterally diffused metal-oxide-semiconductor (LDMOS) transistor, can include a substrate of a first conductivity type and a buried well region of a second conductivity type. The second conductivity type can be opposite the first conductivity type. The LDMOS transistor can further include a body region of the first conductivity type, where the body region can be disposed on the buried well region. The LDMOS transistor can also include a drift region of the second conductivity type, where the drift region is disposed in the body region. The LDMOS transistor can still further include a drain implant of the second conductivity type, where the drain implant can be disposed in the drift region. The LDMOS transistor can also include a source implant of the second conductivity type, where the source implant can be disposed in the body region. The LDMOS transistor can further include a gate structure disposed on the drift region. The gate structure can include a field plate including a RESURF dielectric layer, a gate dielectric layer, and a gate electrode disposed on the field plate and the gate dielectric layer. The LDMOS transistor can also include a drain contact extending through the field plate and defining an Ohmic contact with the drain implant.

Figure 1:
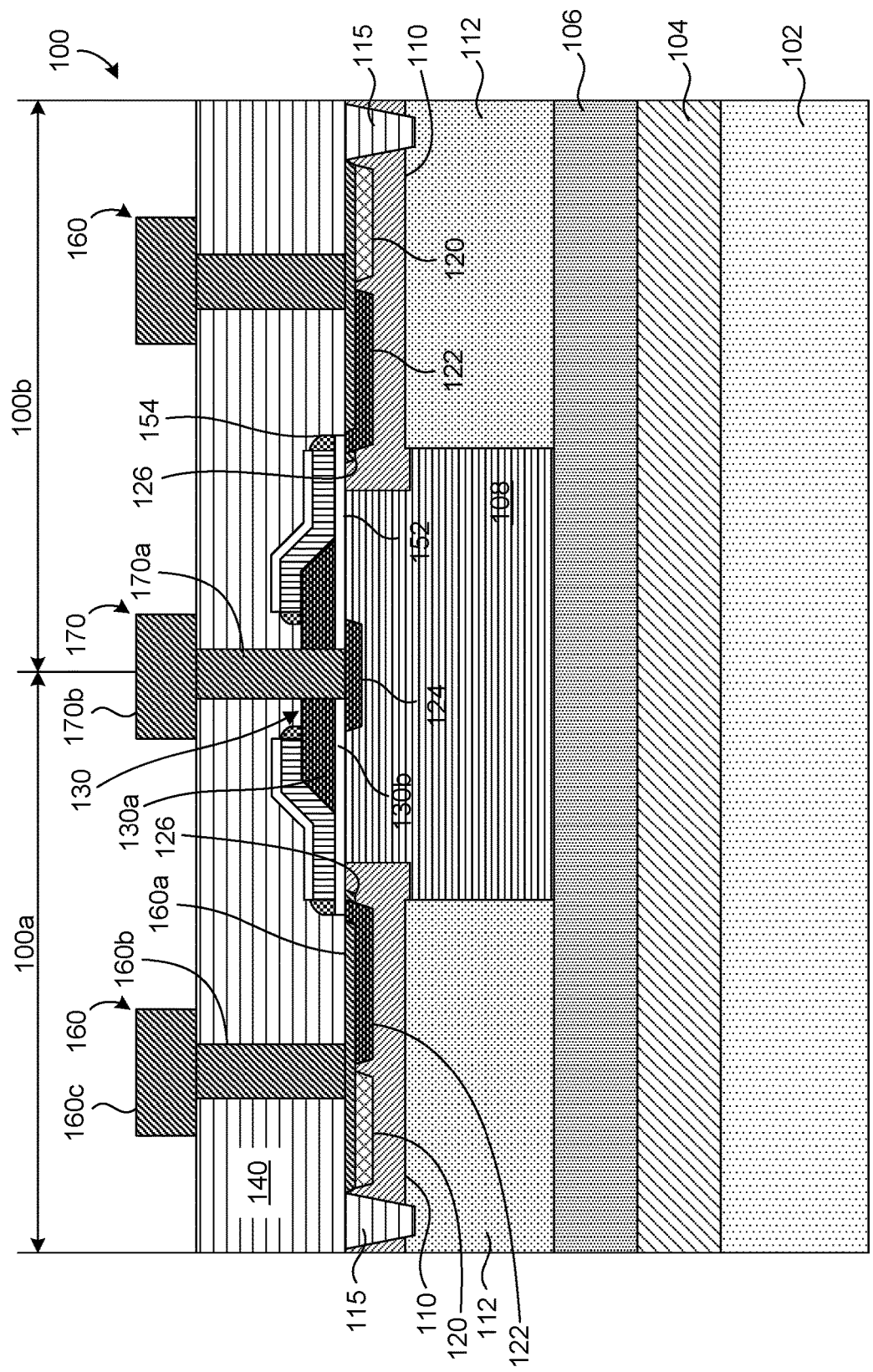
FIG. 1 is a diagram illustrating a cross-sectional view of a laterally diffused metal-oxide-semiconductor (LDMOS) transistor with a RESURF dielectric layer field plate.

Like reference symbols in the various drawings indicate like and/or similar elements. Elements shown in the various drawings are shown by way of illustration and may not necessarily be to scale. Further, scales of the various drawings may differ from one to another depending, at least in part, on the particular view being shown.

The reference characters in the various drawings are provided for purposes of illustration and discussion. Reference characters for like elements may not be repeated for similar elements in the same view. Also, reference characters shown in one view for a given element may be omitted for that element in related views. Also, reference characters for a given element that is shown in different views may not necessarily be discussed with respect to each of those views, or may, in some instances, be referenced with a different reference character.

DETAILED DESCRIPTION

This disclosure is directed to laterally diffused metal-oxide-semiconductor (LDMOS) transistors (LDMOS devices) and associated methods of manufacture. The LDMOS devices described herein can be implemented with comparable cell pitch as current devices, and can have reduced gate charge as compared to those devices. Such gate charge reduction can be realized through the implementation of a RESURF dielectric (RESURF oxide) field plate or field plates that is or are (e.g., for each segment of an associated LDMOS device), disposed over (above, on, vertically aligned with, etc.) an accumulation region of the LDMOS device or LDMOS segment.

In some implementations, the devices and processing methods described herein can be implemented using a non-epitaxial process (e.g., a semiconductor manufacturing process that does not include the formation of epitaxial semiconductor layers). The approaches described herein can be used to produce fully isolated LDMOS devices. For instance, in some implementations, the LDMOS devices described herein can be isolated, e.g., using shallow trench isolation (STI), from other types of devices, such as bipolar devices and/or complementary MOS (CMOS) devices that can be produced (on a same semiconductor die) using a hybrid semiconductor manufacturing process. For instance, such isolated LDMOS devices can be produced using a bipolar, CMOS, DMOS (BCD) hybrid semiconductor manufacturing process platform.

The LDMOS devices described herein can have a number of self-aligned features. For instance, in some implementations, a LDMOS device in accordance with the approaches described herein can have a self-aligned drift region, where the drift region can be co-implanted with a deep body implant (e.g., implanted using a same photolithography mask). In implementations, the LDMOS devices described herein can have drain implant contacts (e.g., formed through a RESURF dielectric field plate) that include self-aligned Ti/Si formed on the drain implant.

As indicated above, the LDMOS devices described herein can be implemented using a field plate (field plates) that include a RESURF dielectric layer. In example implementations, such a field plate (which can be part of a gate structure of the associated LDMOS device) can be placed above an accumulation region of the LDMOS (e.g., an accumulation region a segment of an LDMOS device). The use of a RESURF dielectric field plate can reduce gate charge, as compared with LDMOS implementations, without adversely affecting device breakdown voltage, device on-resistance (e.g., drain to source on-resistance), or hot carrier injection (HCI) performance. That is, simulation results indicate consistent breakdown, on-resistance, and HCI performance (e.g., based on impact ionization location) with current devices, but with reduced gate charge.

Using the processing approaches described herein can prevent loss of STI oxide in other device areas, such as CMOS devices that can be produced in conjunction with an LDMOS device using a BCD semiconductor manufacturing process platform. In some implementations, producing such LDMOS devices can be achieved with limited additional processing added to an existing semiconductor process flow, such as a process flow for producing CMOS devices. For instance, in an example implementation, a CMOS processing flow can be modified by adding, for forming an LDMOS device, operations for forming body regions of the LDMOS, including a deep body region (e.g., a buried body region), and operations for forming a RESURF dielectric layer (structure, etc.) that can be used to form a RESURF dielectric layer field plate of the LDMOS device.

FIG. 1 is a diagram illustrating a cross-sectional view of a LDMOS transistor (device) 100 that includes a RESURF dielectric field plate. In some implementations, the LDMOS device 100 can be implemented as an n-channel (n-type) LDMOS (NLDMOS) device. In some implementations, the LDMOS device 100 can be implemented as a p-channel (p-type) LDMOS (PLDMOS) device, where the conductivity types of each region and implant, as compared to an NLDMOS device implementation, are inverted. That is, p-type material in a NLDMOS is inverted to n-type material in a PLDMOS. Likewise, n-type material in a NLDMOS is inverted to p-type material in a PLDMOS.

In some implementations, the LDMOS device 100 of FIG. 1 can be produced using a semiconductor process, such as using a BCD hybrid semiconductor manufacturing process platform. Example implementations of such manufacturing processes are discussed herein with respect to FIGS. 3 to 15, where FIGS. 3-14B are cross-sectional views of semiconductor process operations that can be used to produce the LDMOS 100. FIG. 15 is a flowchart illustrating a method that can be implemented, in some implementations, using the process operations of FIGS. 3-14B. The structure of the LDMOS 100 is generally described, while further details regarding the elements of the LDMOS 100 and methods for producing an implementation of the LDMOS 100 are discussed further below.

As shown in FIG. 1, the LDMOS can include adjacent segments, segment 100a (left side) and segment 100b (right side). The LDMOS 100 shown in FIG. 1 can be referred to as an LDMOS unit cell, where a plurality of LDMOS unit cells can be combined to form larger LDMOS devices. It will be appreciated that the structure of the LDMOS device 100 of FIG. 1 can extend into and/or out of the page of FIG. 1, so as to establish channel widths of the LDMOS segments 100a and 100b. As the example implementation of FIG. 1 illustrates adjacent segments 100a and 100b of the LDMOS 100, the following discussion describes elements included in each segment, with additional discussion of some elements that are shared between the segments 100a and 100b.

As shown in FIG. 1, the LDMOS 100 can be formed in a substrate 102, where the substrate 102 has a first conductivity type. For instance, for an NLDMOS, the substrate 102 can be a p-type substrate, while for a PLDMOS, the substrate 102 can be an n-type substrate. The LDMOS 100 can include a deep, or buried well region 104 of a second conductivity that is disposed in the substrate 102. The second conductivity type can be opposite the first conductivity type, e.g., n-type for an NLDMOS device and p-type for a PLDMOS.

The LDMOS 100 of FIG. 1 can include a body region of the first conductivity type (e.g., p-type for an NLDMOS), where the body region is disposed on the buried well region 104. In this example, the body region of the LDMOS 100 can include a buried (deep) body region 106 disposed on the buried well region 104, a surface body region 110 for each segment 100a and 100b, and a linking body region 112 for each segment of the LDMOS 100. As shown in FIG. 1, the linking body region 112 is disposed between the buried (deep) body region 106 and the surface body region 110, so as to link the body regions of the first conductivity type to form a continuous body region of the first conductivity type of the LDMOS 100.

The example LDMOS 100 of FIG. 1 further includes a drift region 108 of the second conductivity type (e.g., n-type for an NLDMOS). As shown in FIG. 1, the drift region 108 can be disposed in (within) the body region, though in some implementations, the drift region 108 can be formed prior to at least one or more of the portions of the body region. For instance, in some implementations, the surface body region 110 and the linking body region 112 could be formed after the drift region 108 and be described as being disposed in the drift region 108. In the LDMOS 100, the segments 100a and 100b (and the LDMOS 100 as a whole) can be isolated (e.g., using STI regions) from adjacent devices (e.g., in different device regions, such as bipolar and/or CMOS device regions) formed in a same semiconductor die.

As further shown in FIG. 1, the LDMOS 100, for each segment 100a and 100b, can include a source implant 122 of the second conductivity type that is disposed in the body region. The LDMOS 100 can also include a drain implant 124 of the second conductivity type that is disposed in the drift region 108. In some implementations, such as the LDMOS of FIG. 1, the drain implant 124 can be shared by the segment 100a and the segment 100b. That is, the drain implant 124 can be a common drain implant for the segments of the LDMOS 100.

The LDMOS 100 can also include a gate structure that is disposed on the drift region 108, where the gate structure is formed across the two segments 100a and 100b, and respective gate electrodes for each of the segments are defined from that gate structure. In the example implementation of FIG. 1, the gate structure includes a field plate 130 including a RESURF dielectric layer, a gate dielectric layer 152 (a thermal oxide layer), and a gate electrode 150 disposed on the field plate and the gate dielectric layer. In some implementations, the RESURF dielectric layer of the field plate can include a thermal oxide layer 130b (which can be different than the gate oxide layer 152) and a deposited oxide layer 130a. As shown in FIG. 1, the field plate 130 can be disposed above (on, vertically aligned with, etc.) respective accumulation regions (e.g., near or at the drain implant 124) of each of the segments 100a and 100b, which can reduce total gate charge of the LDMOS 100 as compared to LDMOS devices with planar gate and field plate structures.

The LDMOS 100 of this example also includes a drain contact 170 that extends through the field plate 130, which can define an Ohmic contact with the drain implant 124, such as using the approaches described herein. As with the drain implant 124, the drain contact 170 can be common to (shared by) the LDMOS segments 100a and 100b. The drain contact 170, as shown in FIG. 1, includes a contact fill portion 170a (e.g., tungsten) and a metallization portion 170b. The fill portion 170a can be disposed between respective portions of the gate electrode 150 for each of the segments 100a and 100b.

As shown in FIG. 1, the LDMOS 100 can include, for each segment 100a and 100b, a heavy body implant 120 of the first conductivity type (e.g., p-type for an NLDMOS device). As shown in FIG. 1, the heavy body implants 120 can be adjacent to respective source implants 122. Contacts 160 (e.g., Ohmic contacts) can be formed to the source implants 122, the heavy body implants 120 and the surface body region 110. The contacts 160 can include a silicide material 160a (such as cobalt silicide, etc.), a fill material 160b (e.g., tungsten, etc.) and a metallization material 160c (e.g., aluminum, copper, alloys, etc. As shown in FIG. 1, the contact fill materials 170a and 160b can extend through an interlayer dielectric material 140.

Figure 7:
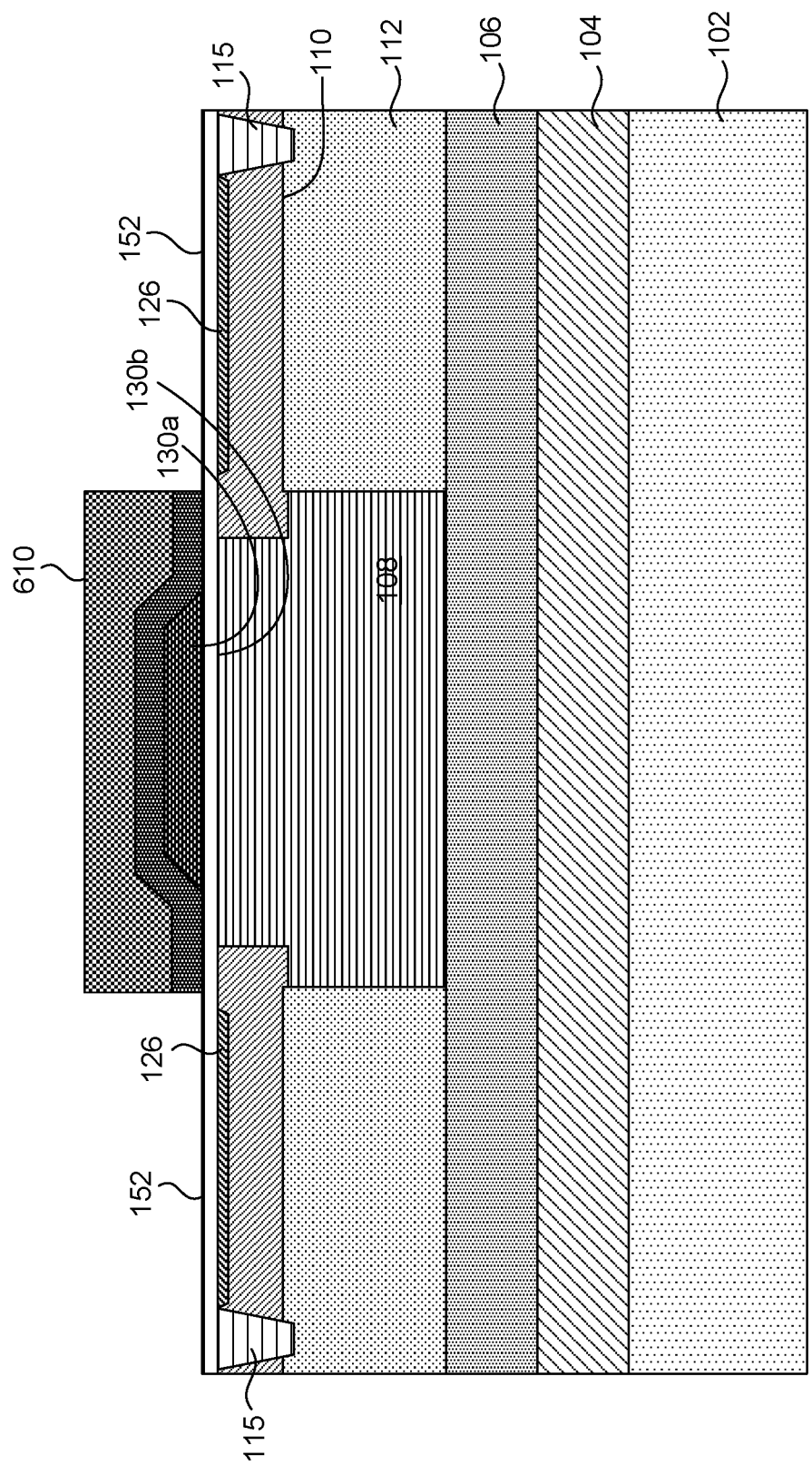

As is also shown in FIG. 1, and more clearly illustrated in, e.g., FIG. 7, each segment 100a and 100b can include a linking (source link) implant 126 of the second conductivity type (e.g., n-type for an NLDMOS). The linking implant 126 can reduce resistance in respective conduction paths between channel regions of the segments 100a and 100b and their respective source implants 122. As further illustrated in FIG. 1, the LDMOS 100 can include gate electrode sidewall spacers 154, which can be formed in conjunction with sidewall spacers formed in other device areas (e.g., such as a CMOS area for a LDMOS being produced in a hybrid process, such as a BCD platform).

Figure 2:
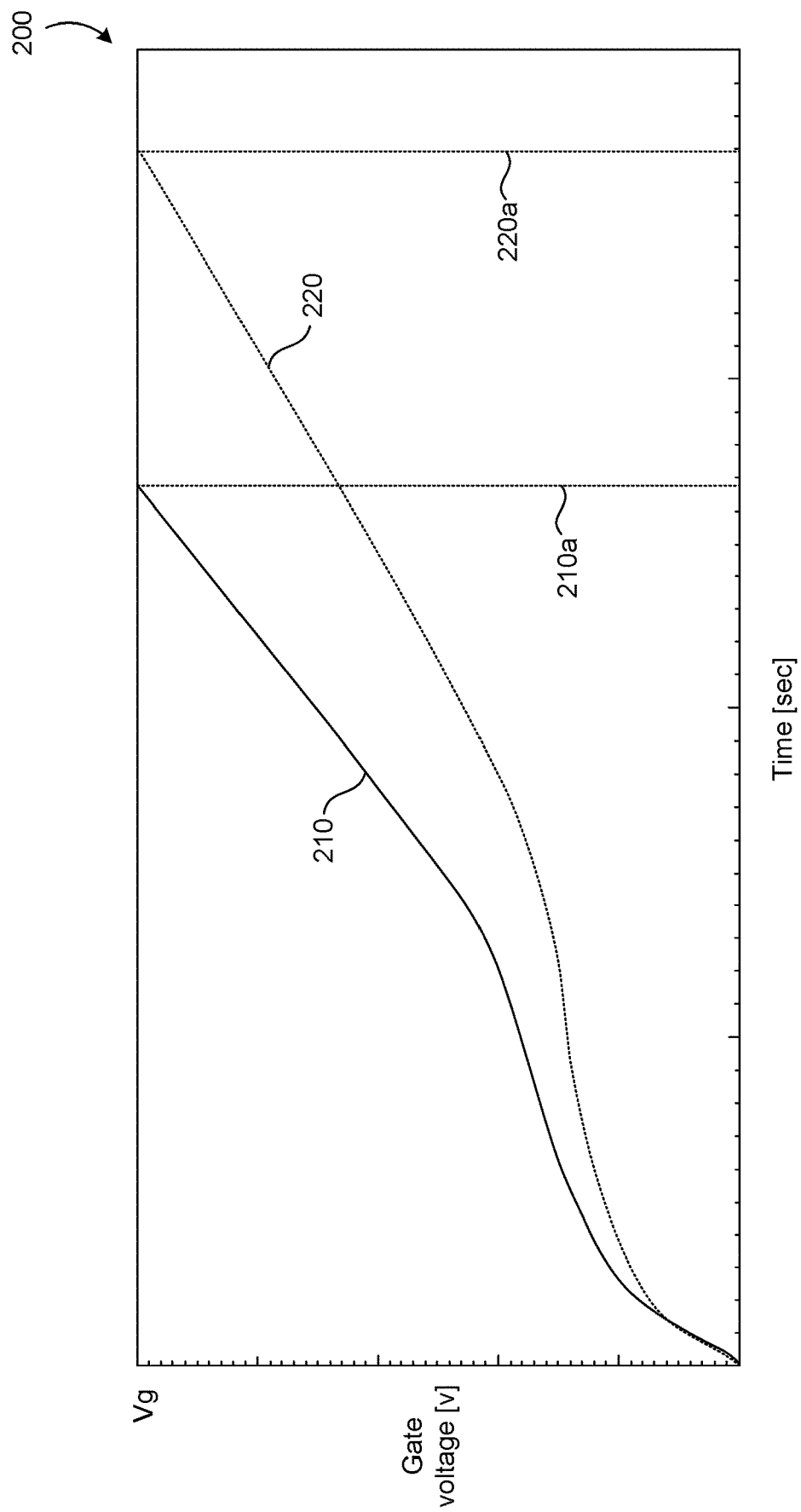
FIG. 2 is a graph illustrating a comparison of gate charge for a LDMOS transistor with a RESURF dielectric layer field plate with gate charge for a current LDMOS with a planar gate and field plate.

FIG. 2 is a graph 200 illustrating a comparison of gate charge for a LDMOS transistor including a RESURF dielectric field plate, such as described herein, with gate charge for a current LDMOS transistor with a planar gate and field plate. In the graph 200, the lines 210 and 210a correspond with the LDMOS transistor with a RESURF dielectric field plate, and the lines 220 and 220a correspond with the LDMOS transistor with a planar gate and field plate. In the graph 200, time is represented on the x-axis, and gate voltage is represented on the y-axis. The lines 210 and 220 represent the respective gate voltages versus time for a given gate current. The lines 210a and 220b indicate the respective amount of time it takes each of the devices to reach a gate voltage (e.g., an operation gate voltage) of Vg.

As can be seen in the graph 200, the LDMOS device with the RESURF dielectric layer field plate (210) reaches a gate voltage of Vg in less time than the LDMOS device with the planar field plate (220). As Qg is given by gate current multiplied by time, it can be seen that the gate charge associated with the line 210a (RESURF dielectric layer field plate device) is less than the gate charge associated with the line 220a (planar field plate device). In fact, in this example, the illustrated simulation results represent a Qg for the device of lines 210 and 210a that is over 25 percent less than a Qg for the device of lines 220 and 220a. In other words, the LDMOS device with the RESURF dielectric layer field plate (e.g., an implementation of the LDMOS 100) demonstrates a decrease in Qg of more than 25 percent as compared to an LDMOS device (e.g., with comparable device dimensions, such as channel width and length) with a planar field plate.

FIGS. 3, 4, 5, 6, 7, 8A, 8B, 9A, 9B, 10A, 10B, 11A, 11B, 12A, 12B, 13A, 13B, 14A and 14B (FIGS. 3 through 14B) are a series of cross-sectional diagrams illustrating operations of semiconductor manufacturing processes that can be used to produce implementations of an LDMOS transistor, such as the LDMOS transistor 100 of FIG. 1. In some implementations, these operations can be performed in an order corresponding with the order of the drawings, or can be performed, as appropriate for a given manufacturing process, in different orders.

Figure 8A:
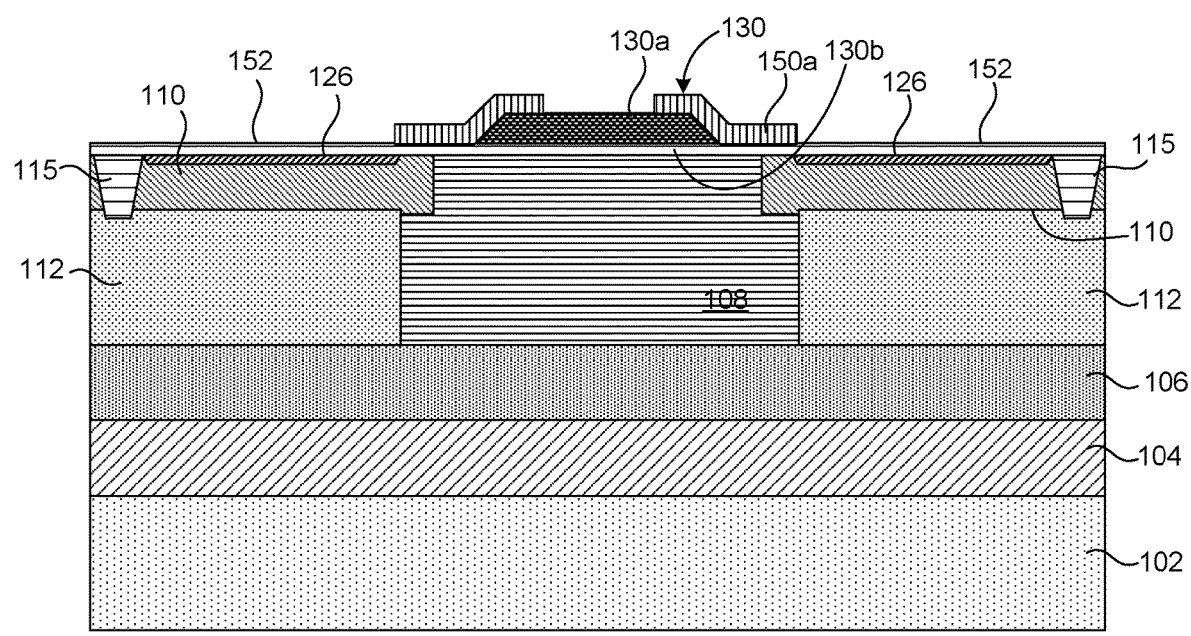
Figure 8B:
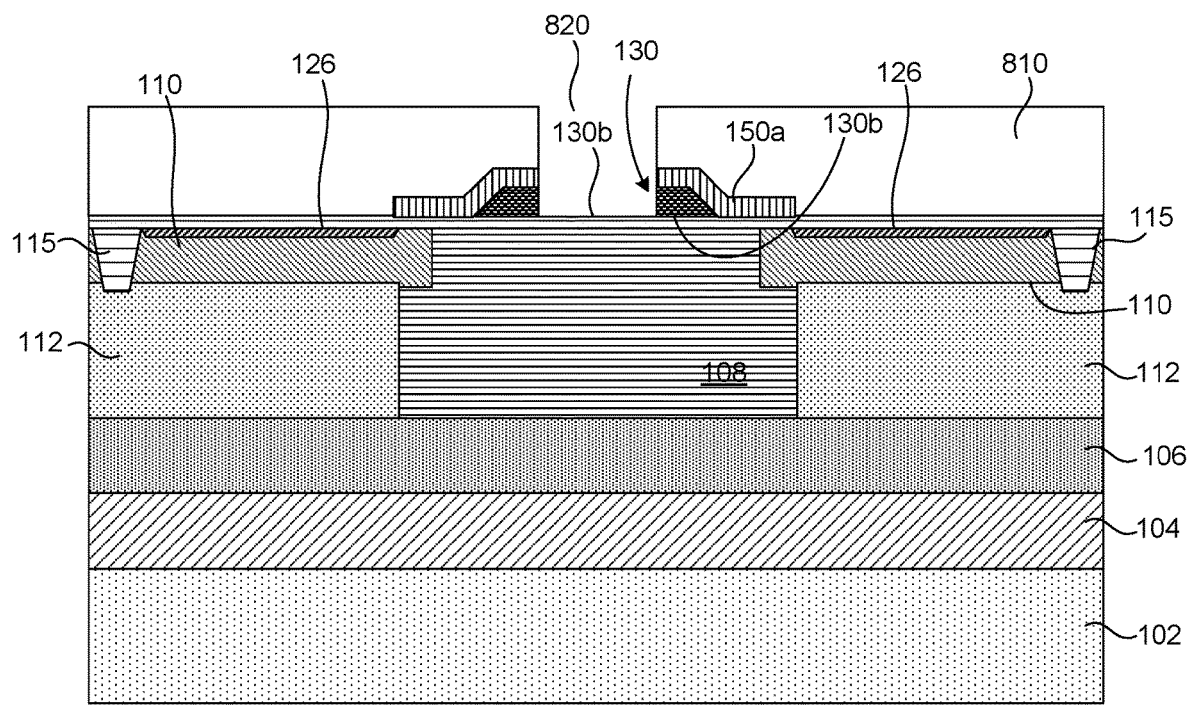

In FIGS. 3 through 14B, there are two different process flows illustrated, where the two process flows diverge from one another, in these examples, beginning with the operations illustrated by FIGS. 8A and 8B. That is, for the two example process flow of FIGS. 3-14B, the process flow operations illustrated by FIGS. 3 through 7 are the same for both processes. Also, the process operations shown in FIGS. 3-14B (with the exception of FIGS. 9A and 9B) are process operations specifically related to forming an isolated (STI isolated) LDMOS device using a hybrid semiconductor process platform (e.g., a BCD process). It will be appreciated that certain elements (such as photolithography masks formed in other device areas) may be not be shown in FIGS. 3-14B, and that process operations performed to define the LDMOS device may be performed in a sequence, or using additional process operations, so not as to adversely affect devices in other device areas (e.g., not etching of the RESURF dielectric layer field plate as shown in FIG. 8A, or using an additional photomask to etch the RESURF dielectric layer field plate as shown in FIG. 8B, so as not to cause STI loss in a CMOS device area).

Further, while separate diagrams are shown for process operations of these example implementations starting with FIGS. 8A and 8B through FIGS. 14A and 14B, some of the operations illustrated by those drawings are very similar and are, therefore, may be described together. Also, while the operations of the process flows of FIGS. 3-14B can be used to produce either an n-channel (n-type) LDMOS transistor, or a p-channel (p-type) LDMOS transistor, for purposes of illustration and clarity, FIGS. 3-14B will be generally described with respect to producing an NLDMOS transistor (device). It will be appreciated, however, that a PLDMOS device can also be produced using the process flows of FIGS. 3-14B by inverting the respective polarities of the each of the regions and implants that are described with respect to producing an NLDMOS device (i.e., replacing n-type with p-type, and replacing p-type with n-type). Still further, the operations of the FIGS. 3-14B are further discussed with respect to the method 1500 shown in FIG. 15, and are described further below.

Figure 3:
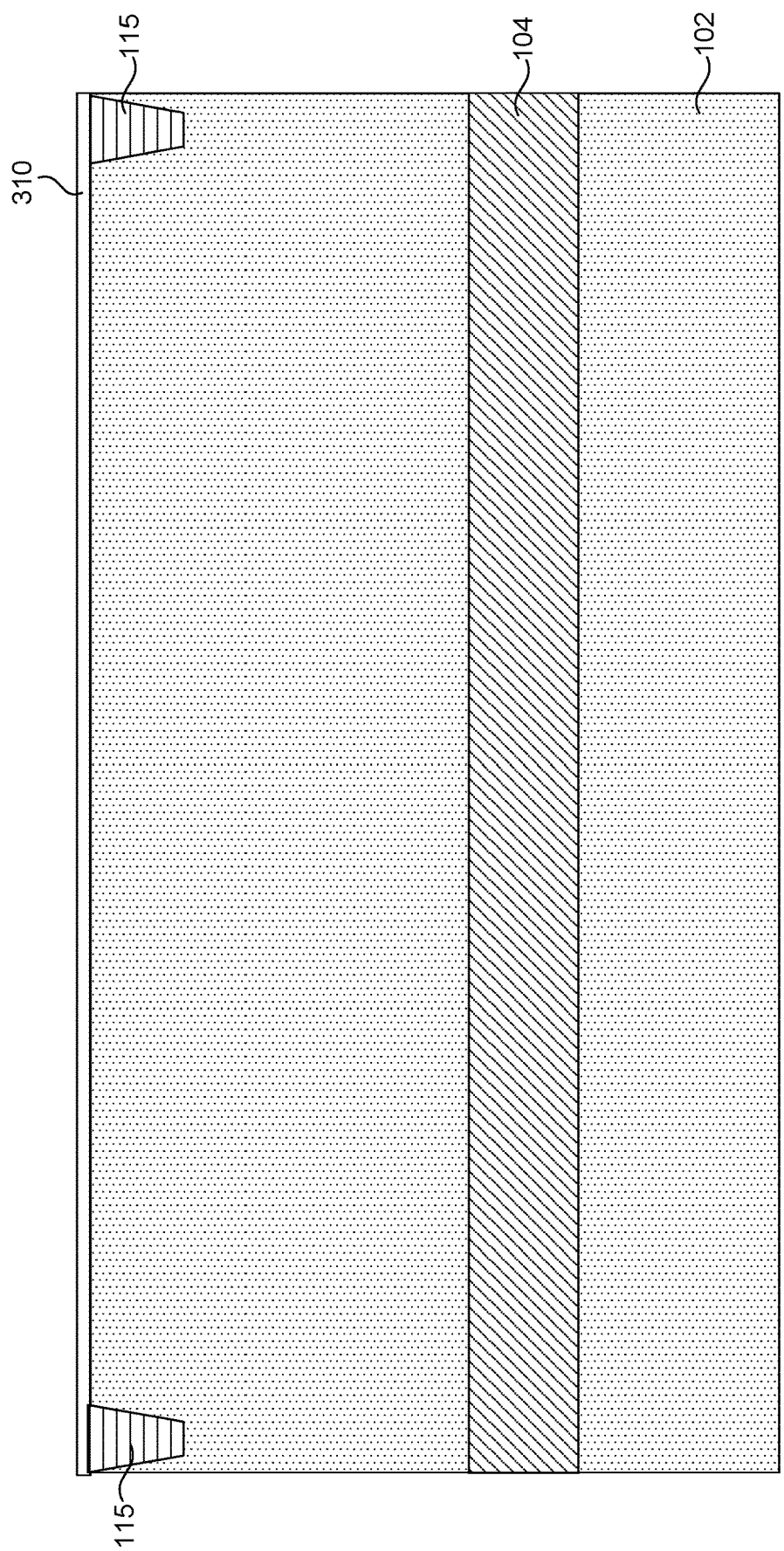
FIGS. 3, 4, 5, 6, 7, 8A, 8B, 9A, 9B, 10A, 10B, 11A, 11B, 12A, 12B, 13A, 13B, 14A and 14B are a series of cross-sectional diagrams illustrating operations of semiconductor manufacturing processes that can be used to produce implementations of an LDMOS transistor, such as the LDMOS transistor of FIG. 1.

Referring to FIG. 3, the manufacturing process for producing a LDMOS device, and specifically an NLDMOS device in these examples, can begin by forming STI regions 115 (e.g., STI oxides) in a p-type substrate 102. As also shown in FIG. 3, a screen oxide layer 310 can be formed on a surface of the substrate 102. After forming the STI regions 115 and the screen oxide layer 310, a deep (buried) n-well (DNW) region 104 can be formed in the substrate 102. In some implementations, forming the DNW region 104 can include forming a photolithography mask (not shown) that is used as an implant mask to define the DNW region 104. After formation of the DNW region 104 (e.g., using a high energy implant through the screen oxide 310), an anneal operation can be performed, which can activate the implant of the DNW region 104, as well as repair damage to the substrate 102 resulting from the high-energy implant operation.

Figure 4:
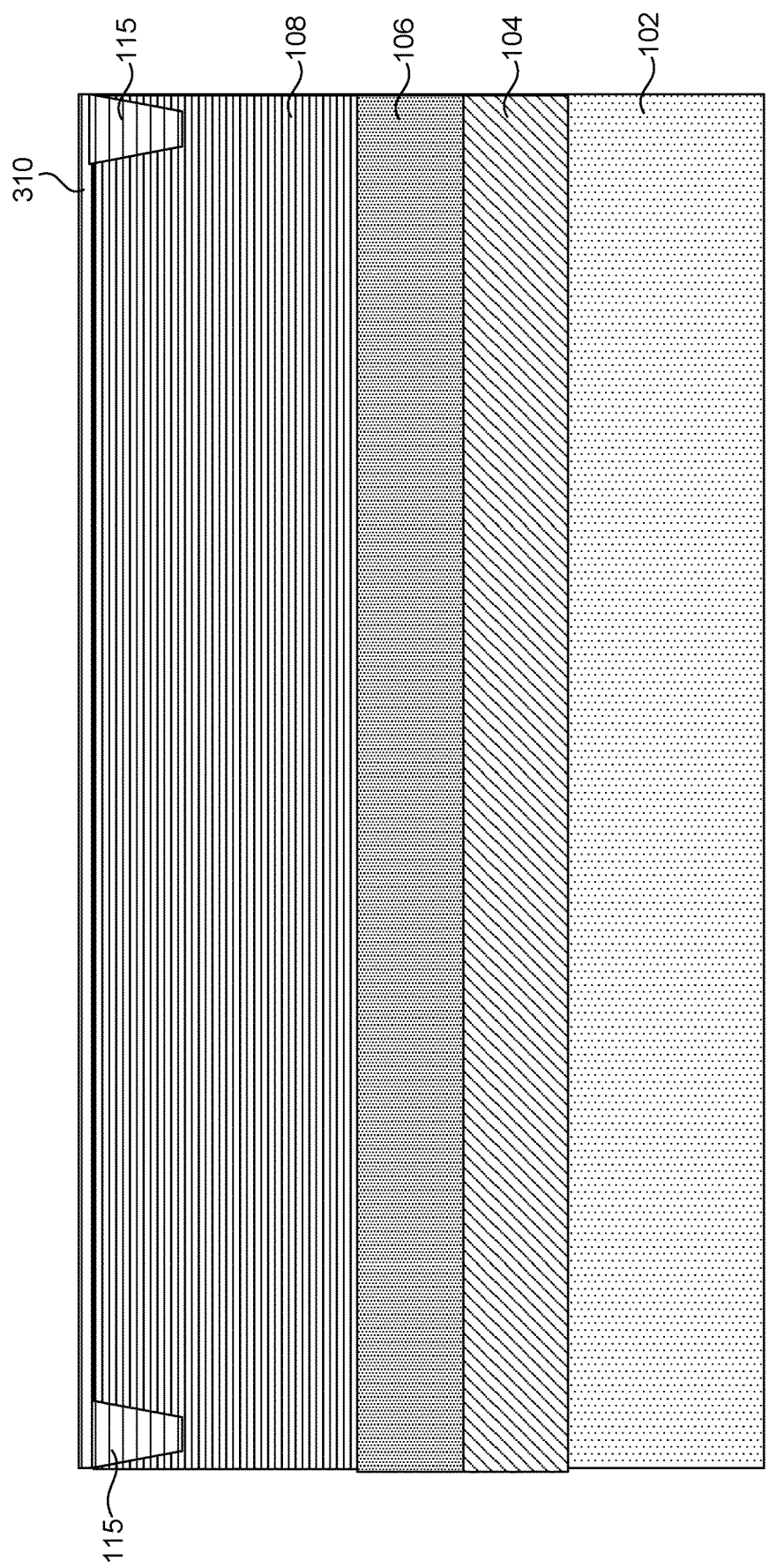

Referring to FIG. 4, the photolithography mask used to define the DNW region 104 can be removed and another photolithography mask (not shown) can be formed, where the new mask can be used to define areas where the p-type deep body region 106 and the n-type drift (n-drift) region 108 are to be formed (e.g., for the LDMOS device and/or other devices being produced). In the operations illustrated by FIG. 4, the deep p-body region 106 and the n-drift region 108, in this example implementation, are formed using the same photolithography mask. Accordingly, the deep p-body region 106 and the n-drift region 108 can be referred to as being co-implanted, though they are, in this example, formed using respective p-type and n-type implants through the screen oxide 310. In some implementations, another anneal can be performed after forming the deep p-body region 106 and the n-drift region 108.

Figure 5:
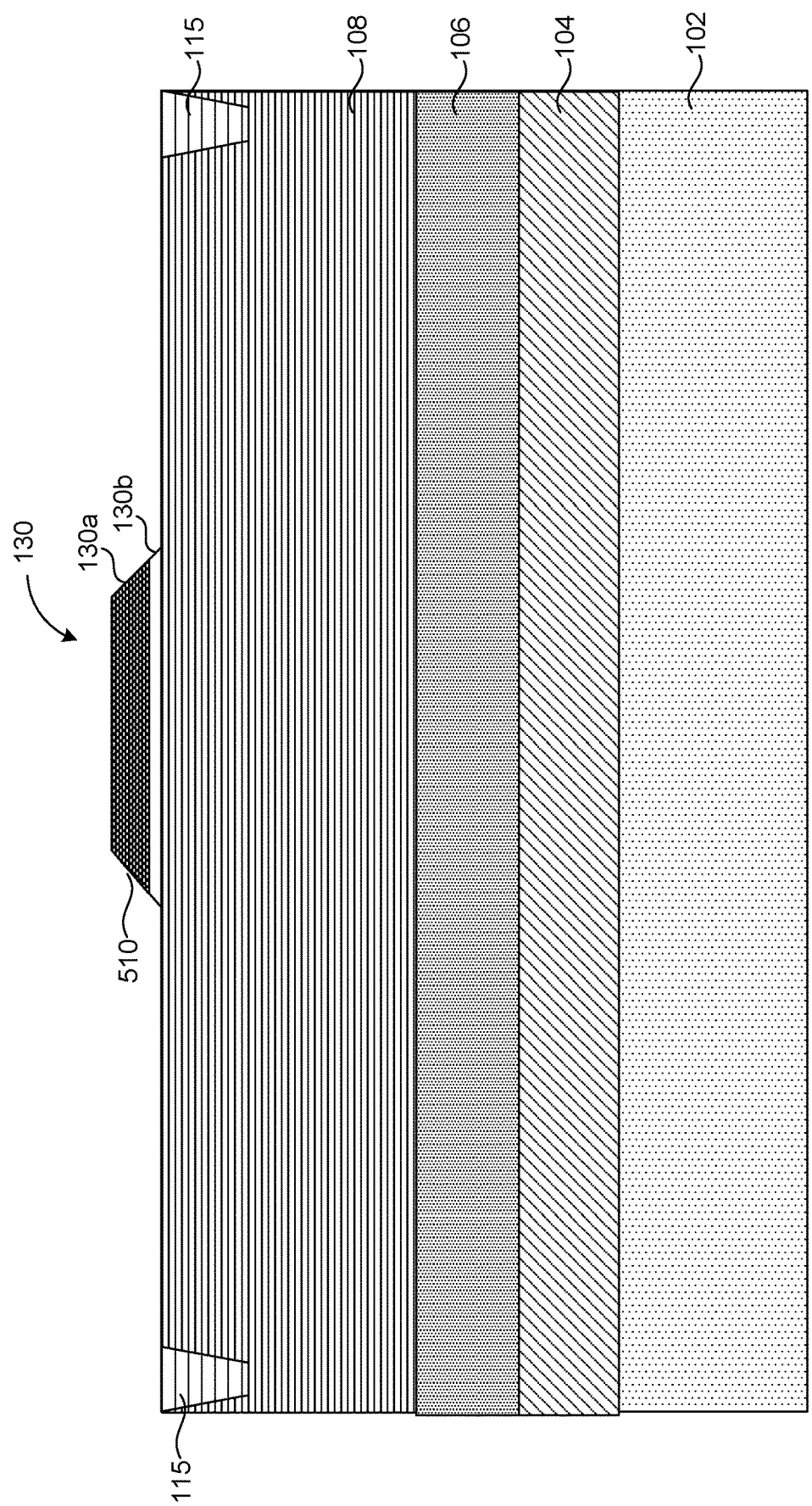

Referring to FIG. 5, operations for forming the RESURF dielectric field plate 130 are illustrated. These operations can include removing (etching) the screen oxide 310, growing a thermal oxide layer 130b (e.g., which can be part of a pad oxide layer), and forming a deposited oxide layer 130a on the thermal oxide layer 130b. Photolithography and etching operations can then be performed to pattern the field plate 130 (e.g., the deposited oxide layer 130a and the thermal oxide layer 130b). In some implementations, such as the example of FIG. 5, the deposited oxide layer 130a can etch at a faster rate than the thermal oxide layer 130b. This difference in etch rate can result in the sloped profile 510 shown at the ends of the field plate 130 (e.g., the left and right ends of the field plate 130 in the orientation of FIG. 5).

Figure 6:
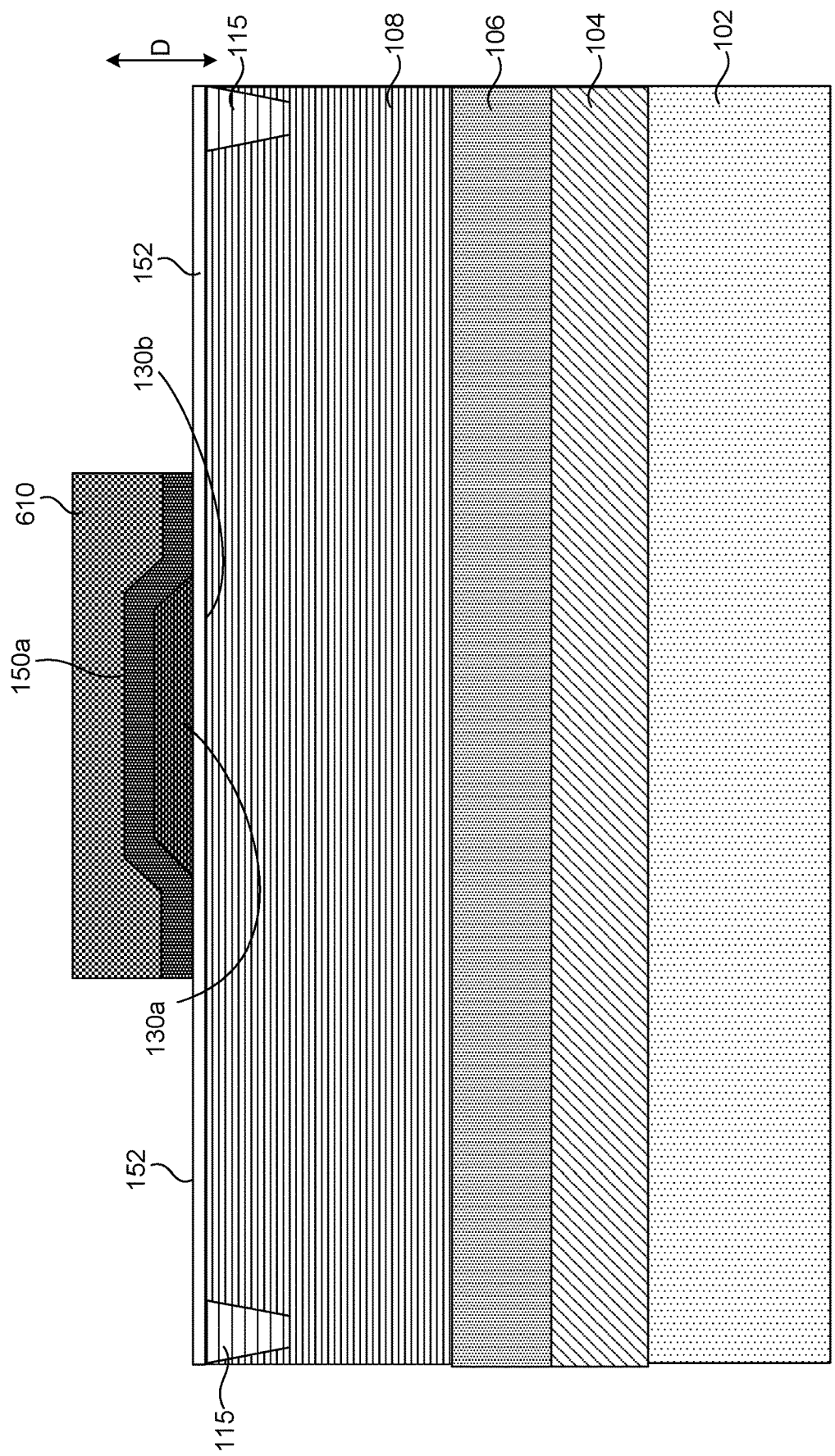

Referring to FIG. 6, a thermal oxide can be grown to form the gate dielectric layer 152. As shown in FIG. 6, in this example, the gate dielectric layer 152 and the thermal oxide layer 130b of the field plate 130 can form a continuous dielectric (e.g., thermal oxide) layer. As further shown in FIG. 6, polysilicon can be deposited to form a polysilicon portion 150a of a gate electrode for the NLDMOS. In some implementations, an implant (p-type in this example) can be performed to dope the polysilicon used to define the polysilicon portion 150a of the gate dielectric such that the polysilicon has a high sheet resistance, such as for use in forming polysilicon resistors in other areas device of a semiconductor die that also includes the LDMOS device (such as can be produced using a BCD process). As also illustrated in FIG. 6, a photolithography mask 610 can be formed, and the polysilicon can be etched to form (define, pattern, etc.) the polysilicon portion 150a of the gate electrode 150.

In some implementations, a thickness (along line D in FIG. 6) of the field plate 130 can be adjusted to achieve desired Qg, on-resistance, and breakdown voltage. For instance, in an example implementation, an overall thickness of the field plate 130 can be on the order of 1000 angstroms, where the thermal oxide layer 130b can be, e.g., on the order of 150 angstroms and the deposited oxide layer 130a can be, e.g., on the order of 850 angstroms As shown in FIG. 7, the photolithography mask 610 of FIG. 6 can be used as an implant mask when performing respective implants to form the surface p-body region 110, the linking p-body region 112 and the source n-linking implant 126. In some implementations, the surface p-body region 110 a can be formed using a large-tilt, angled implant, so that the surface p-body region 110 extends under the gate dielectric 152 and the gate electrode. The linking p-body region 112 can be implanted such that it is disposed between the surface p-body region 110 and the deep p-body region 106, e.g., so as to form a continuous p-body region for the LDMOS device. As shown in FIG. 6, the n-linking implant 126 can be configured to provide a n-type diffusion link between a channel region of the LDMOS (e.g., below the gate dielectric in the surface p-body region) with the source implant 122 and/or the source contact 160 (to be formed later).

Figure 9A:
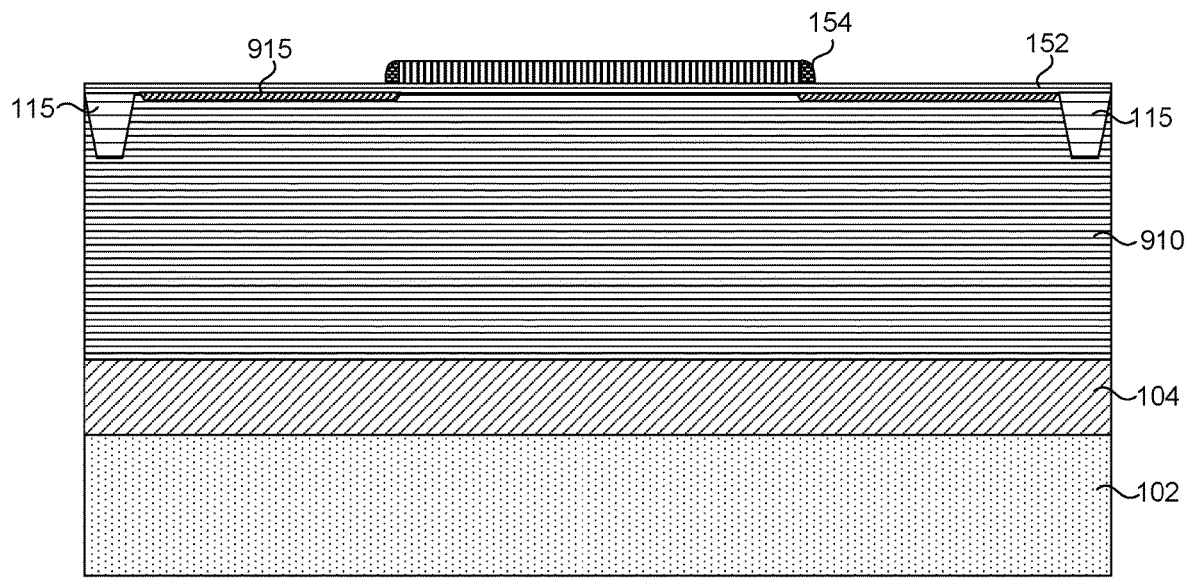
Figure 9B:
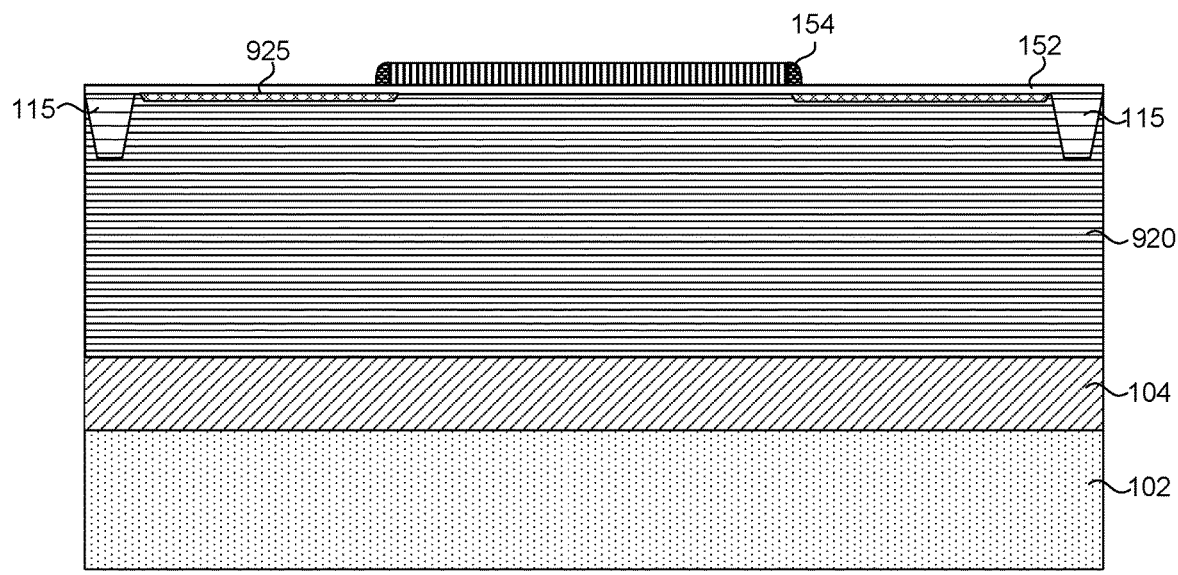

As noted above, the example semiconductor manufacturing processes of FIGS. 3-14B diverge starting with the operations of FIGS. 8A and 8B. In both FIGS. 8A and 8B, the polysilicon portion 150a (of the gate electrode 150) is patterned to define respective gate electrode portions for adjacent segments of an LDMOS, such as the LDMOS segments 100a and 100b shown in FIG. 1. In the example implementation shown in FIG. 8A, the field plate 130 is not etched. However, in the example implementation shown in FIG. 8B, a photolithography mask 810 is defined, and the field plate 130 can be etched, using the mask 810, through the deposited oxide 130a of the RESURF dielectric layer field plate 130 to the thermal oxide layer 130b (e.g., in the area where the drain implant 124 will be formed). In some implementations, the drain implant 124 (such as shown in FIG. 1) can be formed as a self-aligned, tilted (angled) drain implant through the thermal oxide 130b, e.g., using the photolithography mask 810, and the etched deposited oxide 130a of the field plate 130 to define such a self-aligned drain implant. Such an approach can be used for producing an adaptive RESURF LDMOS device, such as the LDMOS 100 of FIG. 1. In some implementations, the photolithography mask can be removed after forming the self-aligned drain implant FIGS. 9A and 9B illustrate process operations that can be performed in a CMOS device region that is associated with the LDMOS region being described, such as in a same semiconductor die that is produced using a hybrid semiconductor manufacturing processes, such as a BCD process. For instance, FIG. 9A illustrates formation of a p-well 910 and formation of an n-type lightly doped drain region (NLDD) 915, which can be used for forming n-type CMOS transistors. Likewise, FIG. 9B illustrates formation of a p-well 920 and a p-type lightly doped drain region (PLDD) 925, which can be used for forming p-type CMOS transistors. Also, as shown in both FIGS. 9A and 9B, spacers 154 (e.g., gate electrode sidewall dielectric spacers) can be also be formed on sidewalls of gate electrodes for the n-type and p-type MOS transistors being formed. Likewise, spacers 154 (e.g., shown in FIGS. 10A and 10B) of an LDMOS device can be formed using the same process operations used to form the spacers 154 shown in FIGS. 9A and 9B.

Figure 10A:
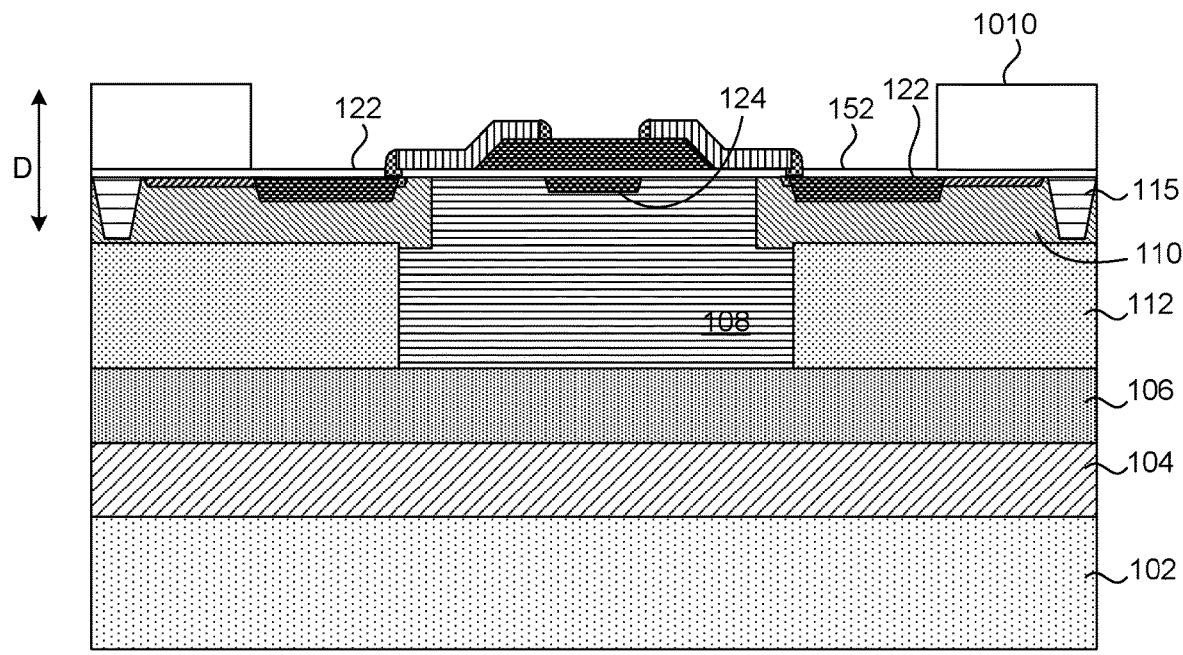
Figure 10B:
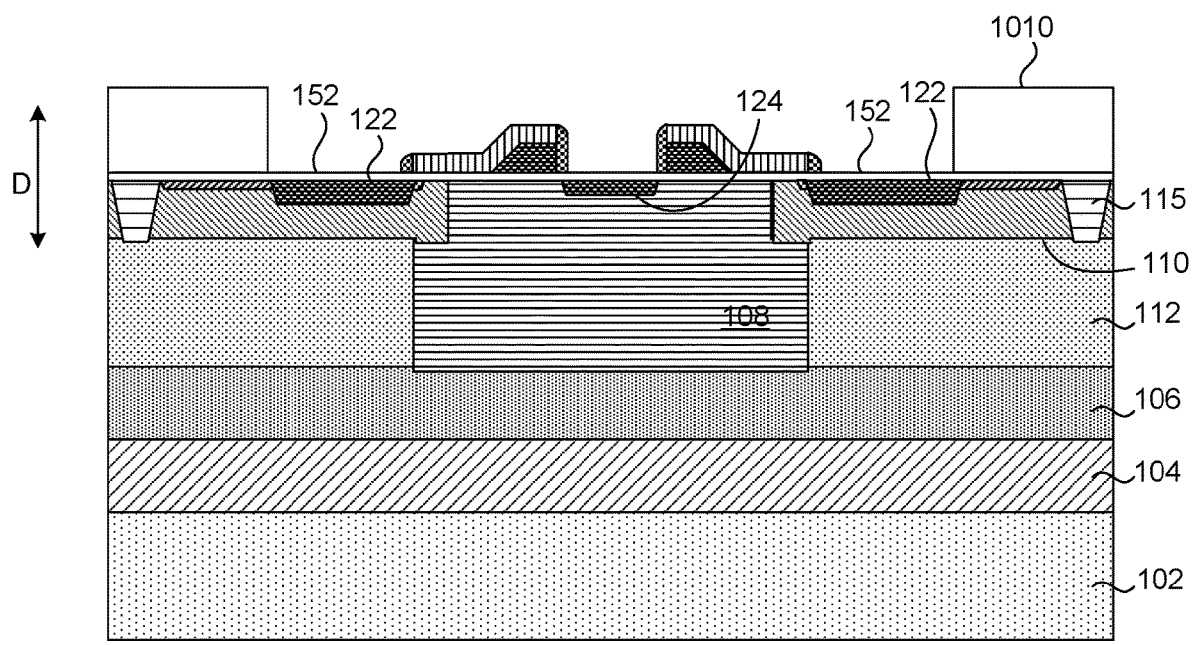

Referring to FIGS. 10A and 10B, source implants 122 and a shared or common drain implant 124 can be formed. For instance, as discussed herein, the drain implant 124 can be shared by adjacent LDMOS segments (e.g., the segments 100a and 100b of the LDMOS device 100 of FIG. 1). As shown in both FIGS. 10A and 10B, in these example implementations, a photolithography mask 1010 can be formed, and one or more blanket implants can then be performed to define the source implants 122 and the (shared) drain implant 124. In the example implementation of FIG. 10A, where the field plate 130 is not etched in the area of the drain implant 124, a chain implant (an implant with two different energies) can be performed. For instance, the chain implant of FIG. 10A can include a first blanket n-type implant at a first energy (e.g., 50 keV) and a second blanket n-type implant at a second, higher energy (e.g., 100 keV). In FIG. 10A, because the field plate is not etched, only the second implant may have sufficient implant energy to penetrate the field plate to form the drain implant 124, with both the first n-type implant and the second n-type implant forming the source implants 122 (as there is only gate dielectric 152 disposed on the source implant regions). Accordingly, the source implants 122, in the implementation of FIG. 10A, can have a depth, along the line D, that is greater than a depth of the drain implant.

In the implementation of FIG. 10B, where the field plate 130 is etched in the area of the drain implant 124, a single energy n-type implant (e.g., 50 keV) can be performed to form both the source implants 122 and the drain implant 124. In such implementations, the source implants 122 and the drain implant 124 can have a same depth (approximately a same depth) along the line D.

Figure 11A:
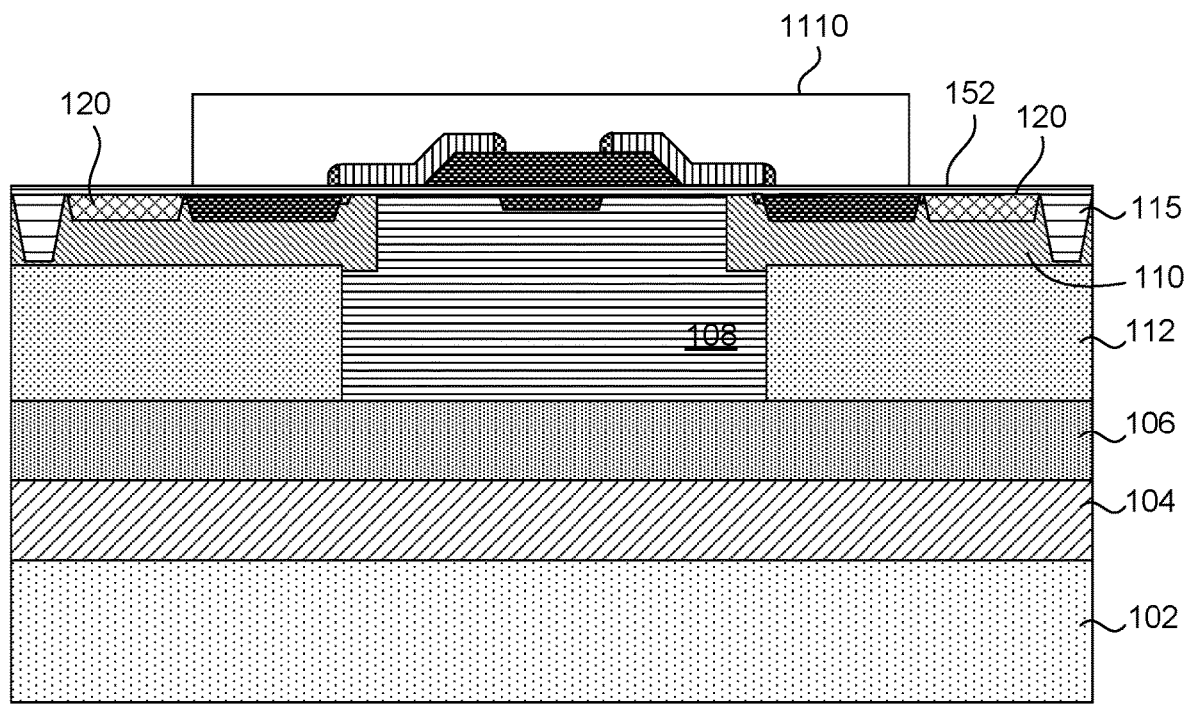
Figure 11B:
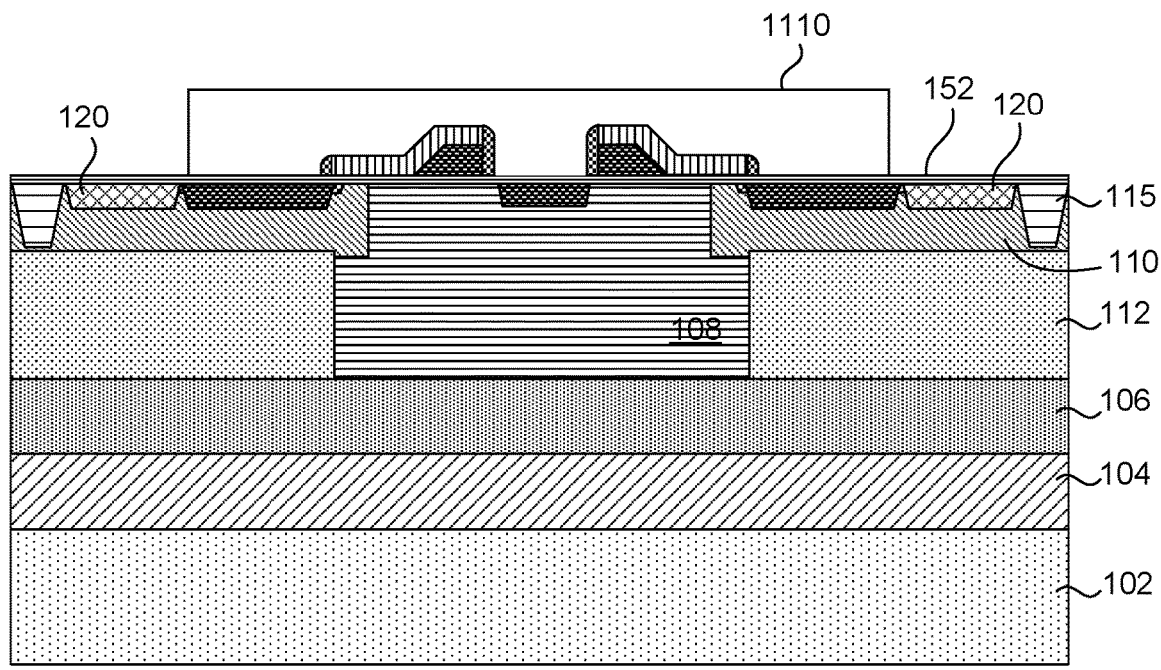

Referring to FIGS. 11A and 11B, the photolithography mask 1010 of FIGS. 10A and 10B can be removed, and a photolithography mask 1110 can be formed. In these example implementations, the photolithography mask 1110 can be used as an implant mask to define the heavy p-body implants 120, which can be formed be a blanket p-type implant through the gate dielectric 152, where the heavy p-body implants 120 are adjacent to respective source implants 122 (and on respective opposite sides of the source implants as the channel regions of the LDMOS device segments).

Figure 12A:
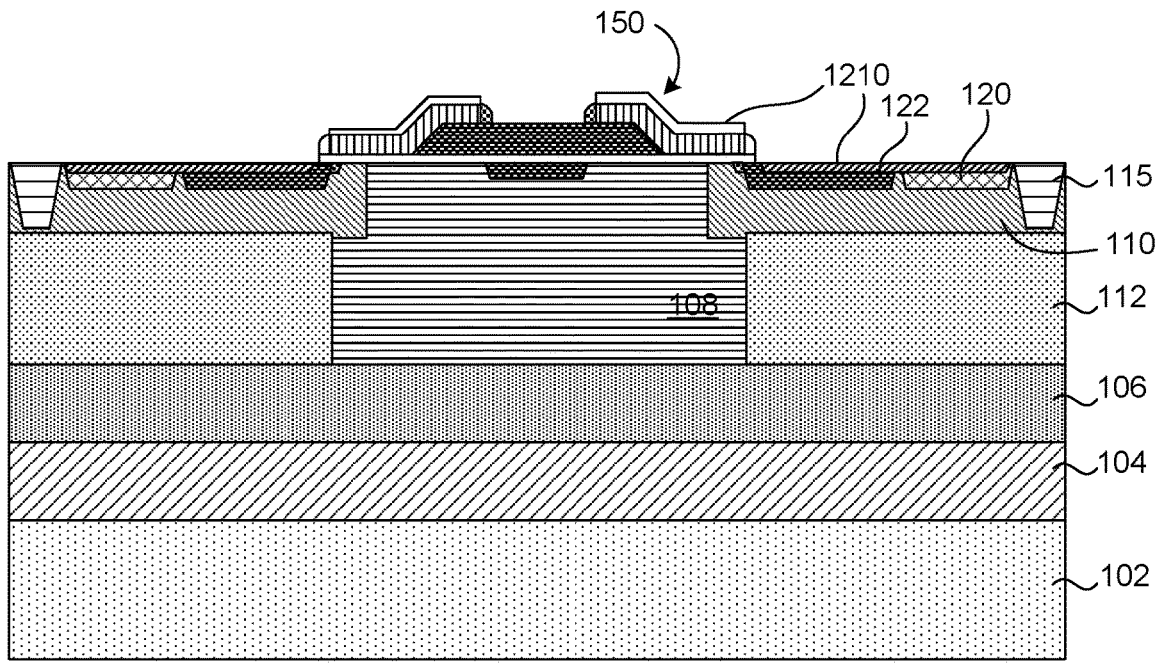
Figure 12B:
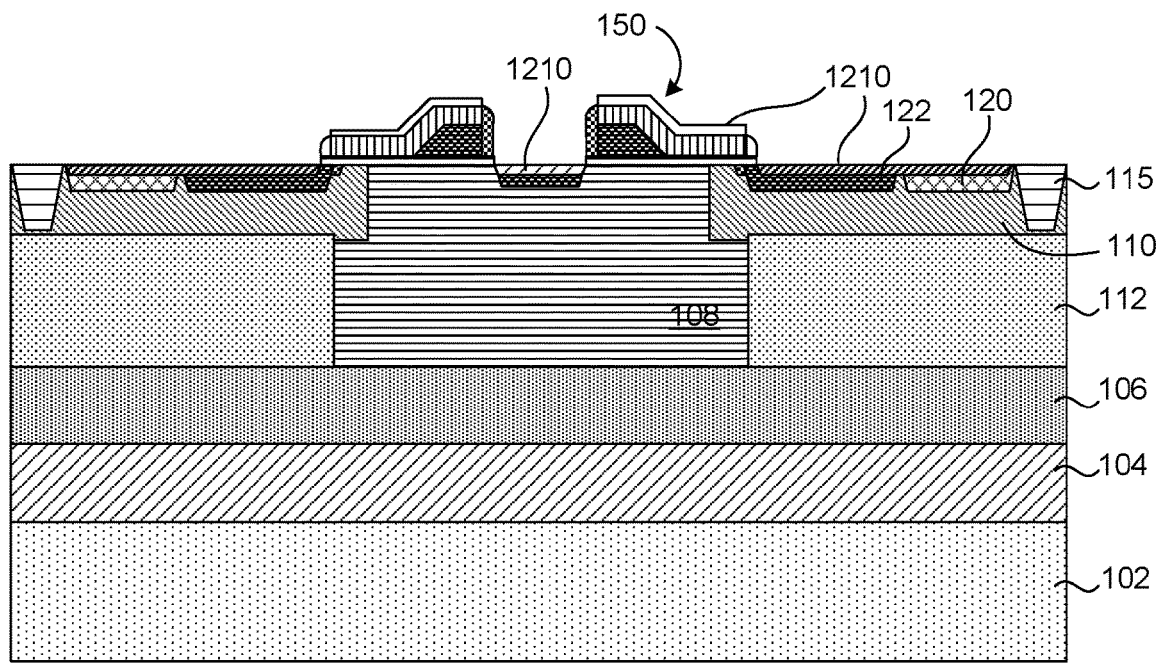

Referring to FIG. 12A and FIG. 12B, the photolithography mask 1110 of FIGS. 11A and 11B can be removed. A silicide block oxide can be deposited and then patterned using photolithography. In this example, the pattern silicide block oxide can block (mask) silicon (including polysilicon) areas where silicide formation is not wanted. After deposition and pattering of the silicide block oxide, in the implementation of FIGS. 12A and 12B, silicide 1210 (e.g., cobalt silicide (CoSi)) can be formed (e.g., where the silicide 1210 can implement the silicide 160a of the LDMOS 100 in FIG. 1). For instance, in the implementations of FIGS. 12A and 12B, silicide 1210 (e.g., CoSi) can be formed on the source implants 122, the heavy body implants 120, and the surface body region 110. Further, as shown in FIGS. 12A and 12B, silicide 1210 can also be formed on the polysilicon of the gate electrode 150 (e.g., gate electrode portions for segments 100a and 100b), which can reduce gate resistance for the associated NLDMOS device. In the implementation of FIG. 12B, where the deposited portion 130a of the field plate 130 is etched in the area of the drain implant 124, silicide 1210 (e.g., CoSi) can also be formed on the drain implant 124.

Figure 13A:
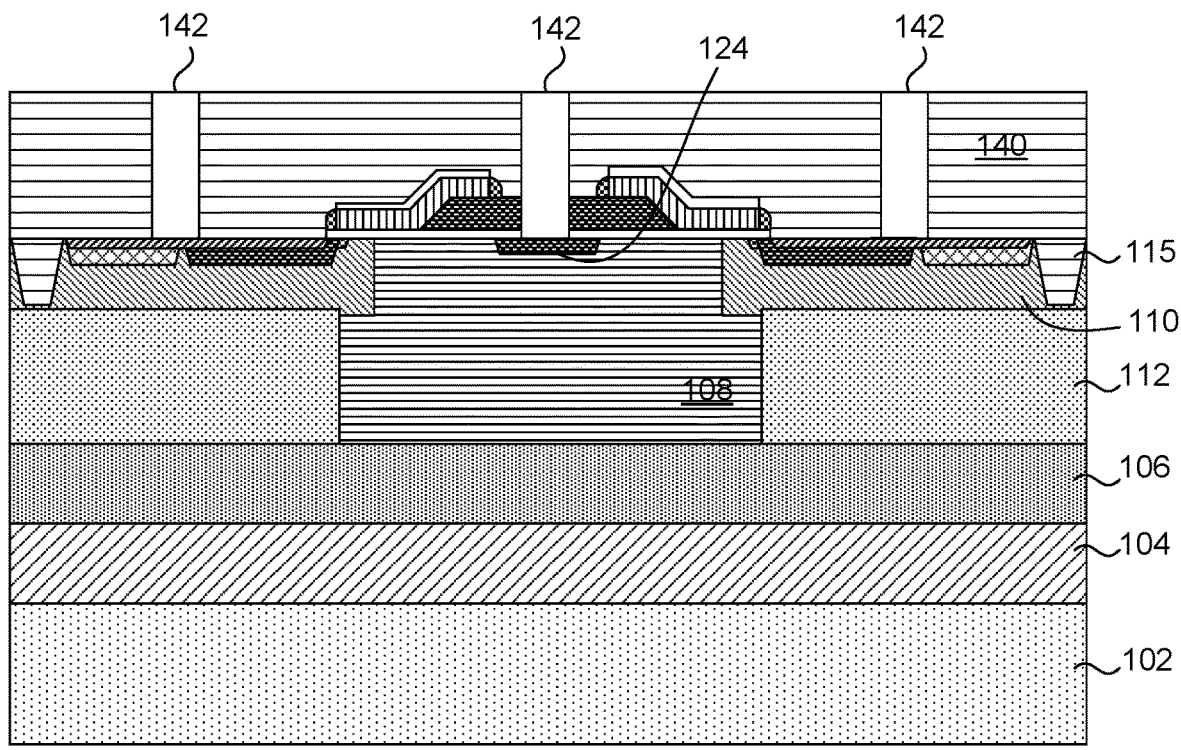
Figure 13B:
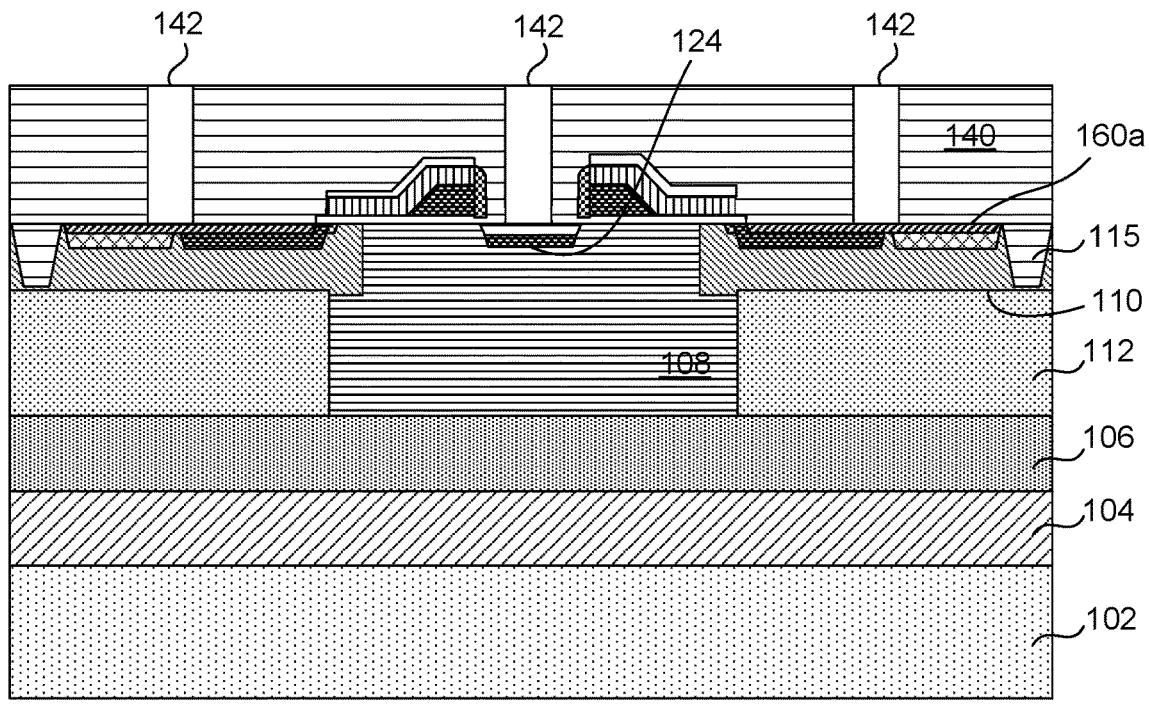

In the example implementations of FIG. 13A and FIG. 13B, an interlayer dielectric layer 140 can be formed and planarized (e.g., using CMP), and contact openings 142 can be defined (etched) in the interlayer dielectric 140. In the implementations of FIGS. 13A and 13B, an etch process performed to form the contact openings 142 can be configured to stop at the silicide that was formed on the source implants and the heavy p-body implants. In the implementation of FIG. 13A, the etch process used to form the contact openings 142 can be further configured to stop at silicon (e.g., of the drain implant 124). In the implementation of FIG. 13B, the etch process used to form the contact openings 142 can, as with the silicide of the source implants and heavy body implants, also stop on the silicide formed on the drain implant 124.

Figure 14A:
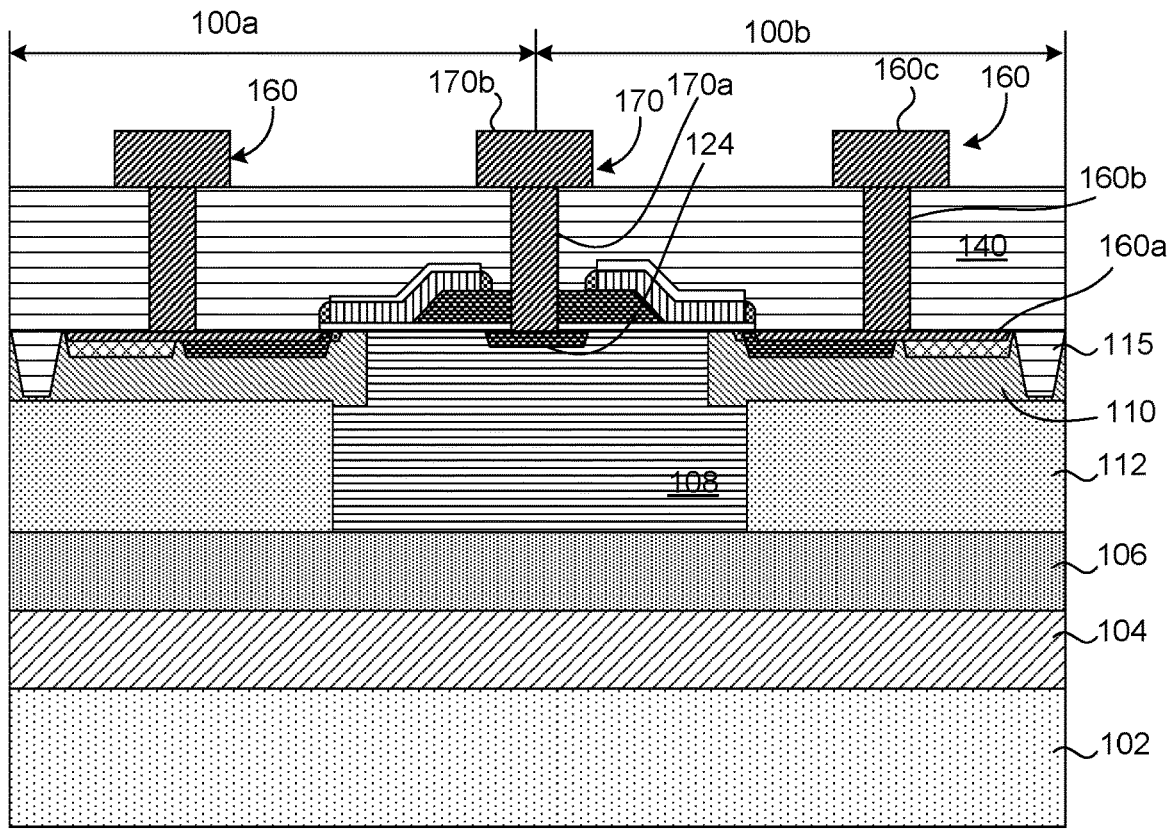
Figure 14B:
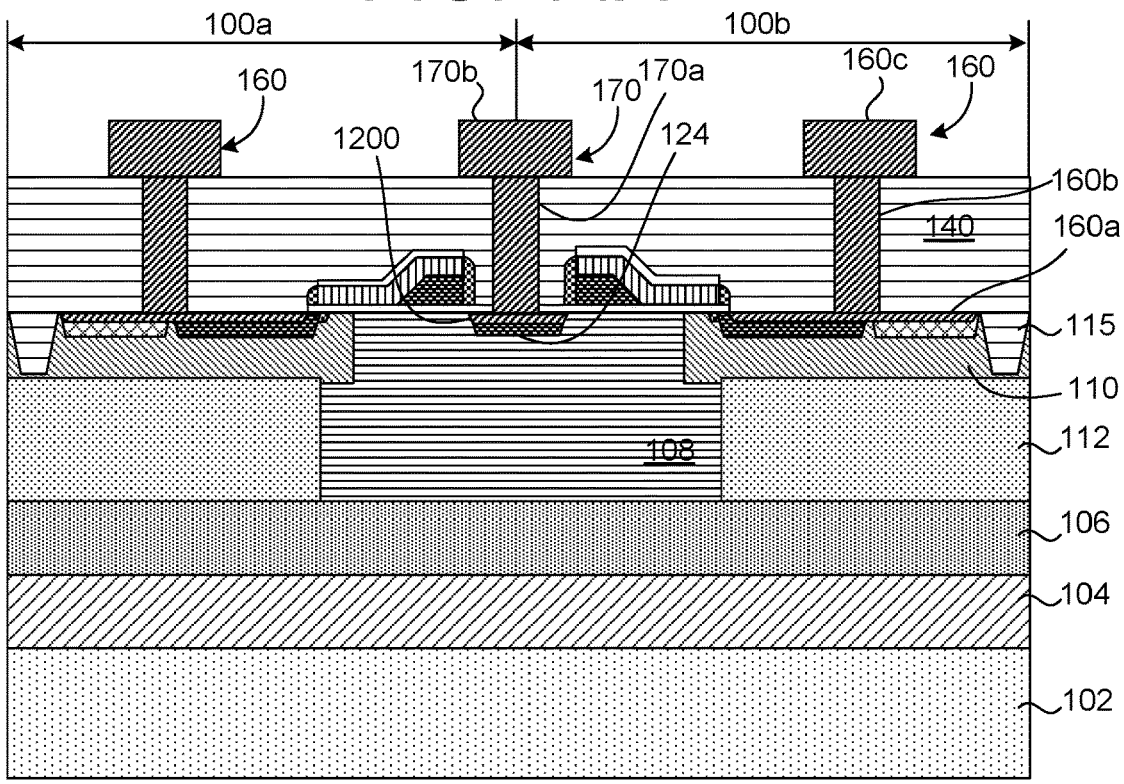
Figure 15:
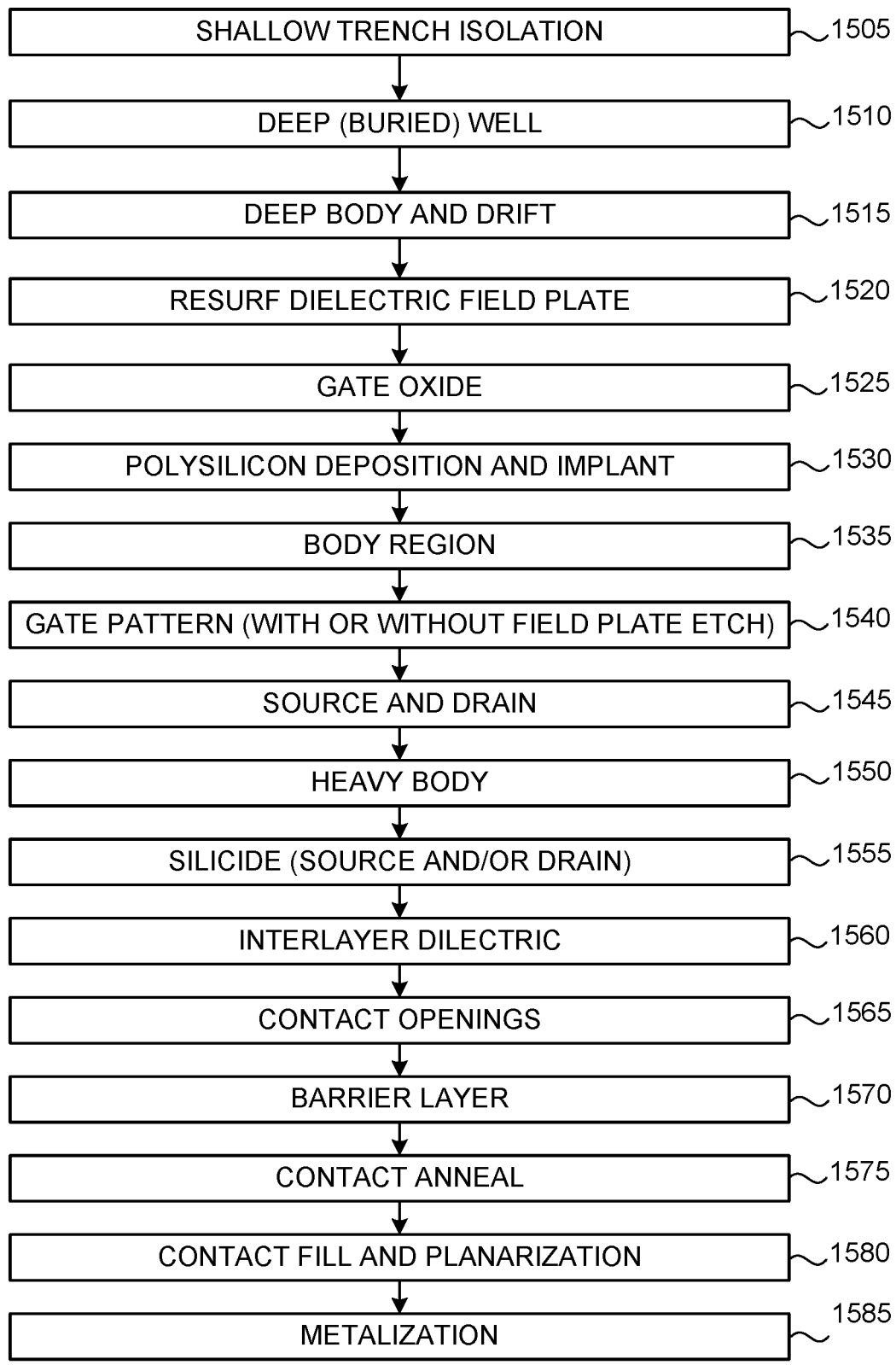
FIG. 15 is a flowchart illustrating a method that can be used to implement the semiconductor manufacturing processes shown in FIGS. 3 through 14B.

FIGS. 14A and 14B illustrate the operations to complete contact formation and metallization for these example implementations. As with the LDMOS 100 of FIG. 1, FIGS. 14A and 14 also illustrates two segments 100a and 100b of an LDMOS transistor that are formed using the example semiconductor manufacturing process implementations illustrated in FIGS. 3 through 14B.

In the example implementations of FIGS. 14A and 14B, a barrier metal (e.g., titanium (Ti)/titanium nitride (TiN)) layer can be formed (deposited, sputtered, etc.) in the contact openings 142, where the barrier metal layer can facilitate formation of high quality Ohmic contacts to the source, body and drain implants and prevent diffusion of material between the silicide and the contact fill material (e.g., tungsten). A rapid thermal anneal can then be performed to reduce contact resistance and cause a reaction between the barrier layer the underlying materials (e.g., the reaction creating a diffusion barrier). Further, in the implementation of FIG. 14A, this anneal can form self-aligned titanium silicide TiSi in the contact opening 142 for the drain implant 124.

For the example implementations of both FIG. 14A and FIG. 14B, a tungsten fill (160b for source/body contacts and 170a for the drain contact) of the contact openings 142 can be performed, and the tungsten fill can then be planarized (e.g., using CMP) such that the top of the tungsten fill is coplanar with an upper surface (in the orientation of FIGS. 14A and 14b) of the interlayer dielectric layer 140. For the implementations of both FIGS. 14A and 14B, metallization (160c for source/body contacts and 170b for the drain contact) can be formed to provide electrical connections to the contact tungsten fill, which can complete formation of the LDMOS device with segments 100a and 100b.

FIG. 15 is a flowchart illustrating a method 1500 that can be used to implement the semiconductor manufacturing processes shown in FIGS. 3 through 14B. Accordingly, for purposes of illustration, further reference will be made to FIGS. 3 through 14B in the discussion of the method 1500. It is noted, however, that in some implementations, the operations of the method 1500 can be implemented using other approaches, and/or in a different order than shown in FIG. 15, or in FIGS. 3 through 14B. Also, for purposes of illustration, the method 1500 will generally be described with reference to producing an n-type (n-channel) LDMOS transistor (NLDMOS). In some implementations, the method 1500 can be used to produce a p-type (p-channel) LDMOS (PLDMOS) transistor, such as by inverting the conductivity types of the various regions and implants of the example NLDMOS device.

In the method 1500, in some implementations, the operation of blocks 1505 and 1510 can correspond with the diagram shown of FIG. 3. For instance, at block 1505, shallow trench isolation 115 for an LDMOS transistor can be formed in the substrate 102 (e.g., a p-type substrate for an NLDMOS transistor). Also, at block 1505, the screen oxide layer 310 of FIG. 3 can be formed. At block 1510, the deep well region (e.g., deep n-well) 104 can be formed, where a photolithography mask can be used to define an area (e.g., an active area) of the LDMOS device, such that the photolithography mask can prevent formation of the deep well region 104 outside the defined area. After formation of the deep well region 104 (e.g., using a high energy implant), an anneal operation can be performed, which can activate the implant of the deep well region 104, as well as repair damage to the substrate 102 resulting from the implant operation.

In the method 1500, the operations at block 1515 can correspond with the diagram shown in FIG. 4. For instance, the photolithography mask used to form the deep well region 104 can be removed and another photolithography mask can be formed to define areas where the deep body region 106 (e.g., deep p-body region) and the drift region 108 (e.g., n-drift region) are to be formed (e.g., for the LDMOS device and/or other devices being produced). As discussed above, because the deep body region 106 and the drift region 108, in this example implementation, are formed using the same photolithography mask, they can be referred to as being co-implanted, though they are formed using respective p-type and n-type implants. In some implementations, another anneal can be performed after forming the deep body region 106 and the drift region 108.

The operations at block 1520 of the method 1500 can correspond with the diagram of FIG. 5. For instance, formation of the RESURF dielectric field plate 130 at block 1520 can include removing the screen oxide 310, growing a thermal oxide 130b (e.g., a pad oxide), and forming a deposited oxide layer 130a on the thermal oxide layer 130b. Photolithography and etching operations can then be performed to pattern the field plate 130. As noted above, the deposited oxide layer 130a can etch at a faster rate than the thermal oxide layer 130b, which can, as a result, produce the sloped profile 510 at the ends of the field plate 130 (e.g., left and right ends in the orientation of FIG. 5).

Blocks 1525 and 1530 of the method 1500 can correspond with the diagram of FIG. 6. In this example implementation, at block 1525, a thermal oxide can be grown to form the gate dielectric layer 152, such that the gate dielectric layer 152 and the thermal oxide layer 130b of the field plate 130 form a continuous dielectric (e.g., thermal oxide) layer, such as shown in FIG. 6. At block 1530, polysilicon can be deposited to form the polysilicon portion 150a of the gate electrode 150 (e.g., as shown in FIG. 1). Further at block 1530, in some implementations an implant (p-type) can be performed to dope the polysilicon with a high sheet resistance, such as for use in forming polysilicon resistors in other areas of a semiconductor die that also includes the LDMOS device produced using the method 1500 (e.g., such as in a CMOS region of a semiconductor die produced using a hybrid semiconductor process). As illustrated in FIG. 6, the photolithography mask 610 can be formed at block 1530 and the polysilicon can be etched to form a polysilicon portion 150a of the gate electrode 150.

At block 1535 of the method 1500, the photolithography mask 610 of FIG. 6 can be retained and used, such as shown in FIG. 7, as an implant mask to perform respective implants to form the surface body (e.g., p-body) region 110 (e.g., using an angled implant), the linking body region 112 and the source linking (n-link) implant 126. As described herein, the linking body region 112 can be disposed between the surface body region 110 and the deep body region 106 to form a continuous body region. As also described herein, the linking implant 126 can link a channel region of the LDMOS with the source implant 122 and/or source contact 160.

In the method 1500, block 1540 can correspond with the diagram of FIG. 8A, or with the diagram of FIG. 8B. For instance, the polysilicon portion 150a (of the gate electrode 150) can be patterned to define respective gate electrode portions for adjacent segments of an LDMOS, such as the LDMOS segments 100a and 100b shown in FIG. 1, as well as in FIGS. 14A and 14B. In some implementations, such as the example shown in FIG. 8A, the field plate 130 is not etched at block 1540. In some implementations, such as shown in FIG. 8B, a photolithography mask 810 can be formed at block 1540, and the field plate 130 can be etched through the RESURF dielectric layer 130a to the thermal oxide layer 130b (e.g., in the area where the drain implant 124 will be formed).

While not shown in FIG. 15, in some implementations, such as in hybrid semiconductor manufacturing processes, p-well and n-well formation can be performed, e.g., after block 1540 and before 1545, such as shown in FIGS. 9A and 9B (e.g., for CMOS devices). Also, spacers 154 (e.g., gate electrode sidewall spacers) can be also be formed (as discussed with respect to FIGS. 9A and 9B), including spacers 154 of an LDMOS devices produced using the method 1500.

At block 1545, which can correspond with the diagram FIG. 10A or the diagram of FIG. 10B, source implants 122 and a (shared or common) drain implant 124 can be formed. For instance, the drain implant 124 can be shared by adjacent LDMOS segments (e.g., the segments 100a and 100b described herein). As shown in FIGS. 10A and 10B, a photolithography mask 1010 can be formed, and one or more blanket implants can be performed to define the source implants 122 and the (shared) drain implant 124. In the implementation of FIG. 10A, where the field plate 130 is not etched in the area of the drain implant 124, at block 1545, a chain implant (an implant with two different energies) can be performed, such as described above with respect to FIG. 10A. In the implementation of FIG. 10B, where the field plate 130 is etched in the area of the drain region 124, at block 1545, a single energy implant can be performed to form the source implants 122 and the drain implant 124, such as described above with respect to FIG. 10B.

At block 1550 of the method 1500, which can correspond with the diagram of FIG. 11A or the diagram of FIG. 11B, the photolithography mask 1010 can be removed and a photolithography mask 1110 can be formed, where the photolithography mask 1110 can be used as an implant mask to define the heavy body (heavy p-body) implants (heavy body regions) 120, as shown in FIGS. 11A and 11B.

At block 1555 of the method 1500, which can correspond with the diagram of FIG. 12A or the diagram of FIG. 12B, silicide 1210 can be formed (e.g., where the silicide 1210 can implement the silicide 160a of the LDMOS 100 in FIG. 1). For instance, in the implementations of FIGS. 12A and 12B, silicide 1210 (e.g., CoSi) can be formed on the source implants 122, the heavy body implants 120, and the surface body region 110. Further, as shown in FIGS. 12A and 12B, silicide 1210 can also be formed on the gate electrode 150 (e.g., the gate electrode portions), e.g., to reduce gate resistance. In the implementation of FIG. 12B, where the field plate 130 is etched in the area of the drain implant 124, silicide 1210 (e.g., CoSi) can also be formed on the drain implant 124.

Blocks 1560 and 1565 of the method 1500 can correspond with the diagram of FIG. 13A of the diagram of FIG. 13B. In these example implementations, an interlayer dielectric layer 140 can be formed and planarized (e.g., using CMP) at block 1560, and contact openings 142 in the interlayer dielectric 140 can be defined at block 1565. In the implementations of FIGS. 13A and 13B, an etch process performed to form the contact openings 142 can be configured to stop at the silicide formed on the source regions and the heavy body regions (e.g., at block 1555). In the implementation of FIG. 13A, the etch process used to form the contact openings 142 can be further configured to stop at silicon (e.g., of the drain implant). In the implementation of FIG. 13B, the etch process used to form the contact openings 142 can, as with the silicide of the source and heavy body regions, also stop on the silicide formed on the drain implant.

Blocks 1570 through 1585 of the method 1500 can correspond with the diagram of FIG. 14A or the diagram of FIG. 14B. As with the LDMOS 100 of FIG. 1, FIGS. 14A and 14 also illustrates two segments 100a and 100b of an LDMOS transistor formed using the method of FIG. 15. In these example implementations, at block 1570, a barrier metal (e.g., Ti/TiN) layer can be formed (deposited, sputtered, etc.) in the contact openings 142, where the barrier metal can facilitate formation of high quality Ohmic contacts to the source, body and drain implants. A rapid thermal anneal can then be performed at block 1575 to reduce contact resistance. Further, in the implementation of FIG. 14A, the anneal of block 1575 can form self-aligned TiSi in the contact opening 142 for the drain implant. At block 1580 (for the implementations of both FIG. 14A and FIG. 14B), a tungsten fill (160b for source/body contacts and 170a for the drain contact) of the contact openings 142 can be performed, the tungsten fill can then be planarized (e.g., using CMP) to be coplanar with an upper surface (in the orientation of FIGS. 14A and 14b) of the interlayer dielectric layer 140. At block 1585, metallization (160c for source/body contacts and 170b for the drain contact) can be formed to provide electrical connections to the contact tungsten fill formed at block 1580, which can complete formation of the LDMOS device with segments 100a and 100b.

The various apparatus and techniques described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to (or laterally neighboring), vertically adjacent to (or vertically neighboring), or horizontally adjacent to (or horizontally neighboring), where neighboring can indicate that intervening element may be disposed between the elements being described as adjacent.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A laterally diffused metal-oxide-semiconductor (LDMOS) transistor, comprising:
   a substrate of a first conductivity type;
   a buried well region of a second conductivity type disposed in the substrate, the second conductivity type being opposite the first conductivity type;
   a body region of the first conductivity type, the body region being disposed on the buried well region;
   a drift region of the second conductivity type, the drift region being disposed in the body region;
   a drain implant of the second conductivity type, the drain implant being disposed in the drift region;
   a source implant of the second conductivity type, the source implant being disposed in the body region;
   a gate structure disposed on the drift region, the gate structure including:
      a field plate including a RESURF dielectric layer;
      a gate dielectric layer; and
      a gate electrode disposed on the field plate and the gate dielectric layer; and
   a drain contact extending through the field plate and defining an Ohmic contact with the drain implant.

2. The LDMOS transistor of claim 1, wherein:
   the first conductivity type is p-type; and
   the second conductivity type is n-type.

3. The LDMOS transistor of claim 1, wherein:
   the first conductivity type is n-type; and
   the second conductivity type is p-type.

4. The LDMOS transistor of claim 1, wherein the body region includes:
   a buried body region disposed on the buried well region;
   a surface body region; and
   a linking body region disposed between the buried body region and the surface body region.

5. The LDMOS transistor of claim 1, wherein:
   the RESURF dielectric layer includes:
      a first thermal oxide layer disposed on the drift region and the drain implant; and
      a deposited oxide layer disposed on the first thermal oxide layer; and
   the gate dielectric layer includes a second thermal oxide layer.

6. The LDMOS transistor of claim 1, further comprising a heavy body implant of the first conductivity type disposed in the body region, the heavy body implant being adjacent to the source implant.

7. The LDMOS transistor of claim 6, further comprising a shallow trench isolation dielectric disposed in the body region, the shallow trench isolation dielectric being adjacent to the heavy body implant.

8. The LDMOS transistor of claim 6, further comprising a source contact defining an Ohmic contact with the source implant, the body region and the heavy body implant.

9. The LDMOS transistor of claim 1, wherein the RESURF dielectric layer is disposed on an accumulation region of the LDMOS transistor.

10. The LDMOS transistor of claim 1, wherein the RESURF dielectric layer includes a sloped portion extending from an upper surface of the RESURF dielectric layer to the gate dielectric layer.

11. The LDMOS transistor of claim 1, further comprising a linking implant of the second conductivity type, the linking implant being disposed in the body region.

12. The LDMOS transistor of claim 1, wherein the drain implant is shared between a first segment of the LDMOS transistor and a second segment of the LDMOS transistor.

13. A laterally diffused metal-oxide-semiconductor (LDMOS) transistor, comprising:
 a substrate of a first conductivity type;
 a buried well region of a second conductivity type, the second conductivity type being opposite the first conductivity type;
 a body region of the first conductivity type, the body region being disposed on the buried well region;
 a drift region of the second conductivity type, the drift region being disposed in the body region;
 a drain implant of the second conductivity type, the drain implant being disposed in the drift region;
 a first source implant of the second conductivity type disposed in the body region, the first source implant defining a source region of a first segment of the LDMOS transistor;
 a second source implant of the second conductivity type disposed in the body region, the second source implant defining a source region of a second segment of the LDMOS transistor;
 a gate structure disposed on the drift region, the gate structure including:
  a field plate including a RESURF dielectric layer;
  a gate dielectric layer; and
  a gate electrode disposed on the field plate and the gate dielectric layer, the gate electrode including a first gate electrode portion of the first segment of the LDMOS transistor and a second gate electrode portion of the second segment of the LDMOS transistor; and
 a drain contact extending through the field plate between the first gate electrode portion the second gate electrode portion, the drain contact and the drain implant being shared between the first segment of the LDMOS transistor and the second segment of the LDMOS transistor.

14. The LDMOS transistor of claim 13, further comprising:
 a first source contact to the first source implant; and
 a second source contact to the second source implant.

15. The LDMOS transistor of claim 14, wherein:
 the drain contact includes a first silicide material; and
 the first source contact and the second source contact include a second silicide material that is different than the first silicide material.

16. The LDMOS transistor of claim 13, wherein the RESURF dielectric layer is disposed on respective accumulation regions of the first segment of the LDMOS transistor and the second segment of the LDMOS transistor.

17. A method for forming a laterally diffused metal-oxide-semiconductor (LDMOS) transistor, the method comprising:
 forming, in a substrate of a first conductivity type, a buried well region of a second conductivity type, the second conductivity type being opposite the first conductivity type;
 forming, in the substrate on the buried well region, a deep body region of the first conductivity type;
 forming a drift region of the second conductivity type on the deep body region;
 forming a gate structure on the drift region, the gate structure including:
  a field plate including a RESURF dielectric layer;
  a gate dielectric layer; and
  a gate electrode disposed on the field plate and the gate dielectric layer;
 forming, in the drift region:
  a surface body region of the first conductivity type; and
  a linking body region of the first conductivity type, the linking body region being disposed between the surface body region and the deep body region;
 forming a drain implant of the second conductivity type in the drift region;
 forming a source implant of the second conductivity type in the surface body region; and
 forming a drain contact extending through the field plate, the drain contact defining an ohmic contact with the drain implant.

18. The method of claim 17, wherein forming the source implant and the drain implant includes:
 forming the source implant using a first implant energy and a second implant energy, the second implant energy being greater than the first implant energy; and
 forming the drain implant through the field plate using the second implant energy.

19. The method of claim 17, further comprising, prior to forming the buried well region, forming shallow trench isolation regions of the LDMOS transistor.

20. The method of claim 17, further comprising, prior to forming the drain implant and the source implant, forming a linking implant of the second conductivity type, the linking implant being disposed in the surface body region.

* * * * *